(12) United States Patent
Sagae et al.

(10) Patent No.: US 10,698,315 B2
(45) Date of Patent: Jun. 30, 2020

(54) SUBSTRATE TREATING METHOD

(71) Applicant: SCREEN Holdings Co., Ltd., Kyoto (JP)

(72) Inventors: Chikara Sagae, Kyoto (JP); Masanori Imamura, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 142 days.

(21) Appl. No.: 15/668,801

(22) Filed: Aug. 4, 2017

(65) Prior Publication Data

US 2018/0052394 A1     Feb. 22, 2018

(30) Foreign Application Priority Data

Aug. 18, 2016   (JP) .................................. 2016-160612

(51) Int. Cl.
| | |
|---|---|
| *B05D 3/12* | (2006.01) |
| *G03F 7/16* | (2006.01) |
| *H01L 21/67* | (2006.01) |
| *G03F 7/30* | (2006.01) |
| *H01L 21/02* | (2006.01) |
| *H01L 21/687* | (2006.01) |

(52) U.S. Cl.
CPC ............ *G03F 7/162* (2013.01); *G03F 7/3021* (2013.01); *H01L 21/02087* (2013.01); *H01L 21/6715* (2013.01); *H01L 21/67253* (2013.01); *H01L 21/68764* (2013.01)

(58) Field of Classification Search
CPC ... G03F 7/162; G03F 7/3021; H01L 21/6715; H01L 21/67253; H01L 21/68764; B05D 1/005

USPC ......................................................... 427/240
See application file for complete search history.

(56) References Cited

U.S. PATENT DOCUMENTS

| | | | |
|---|---|---|---|
| 5,843,527 A | 12/1998 | Sanada | .......................... 427/240 |
| 6,033,728 A * | 3/2000 | Kikuchi | .................. B05C 11/08 |
| | | | 427/240 |
| 9,028,915 B2 * | 5/2015 | Chang | ..................... G03F 7/162 |
| | | | 427/240 |
| 2008/0069948 A1 | 3/2008 | Yoshihara et al. | ............ 427/240 |

(Continued)

FOREIGN PATENT DOCUMENTS

| | | |
|---|---|---|
| CN | 104849963 A | 8/2015 |
| JP | 2002-134399 A | 5/2002 |

(Continued)

OTHER PUBLICATIONS

Office Action dated Sep. 6, 2018 in corresponding Taiwan Patent Application No. 106125206.

(Continued)

*Primary Examiner* — Kirsten Jolley
(74) *Attorney, Agent, or Firm* — Ostrolenk Faber LLP

(57) ABSTRACT

Disclosed is a substrate treating method including a solvent supplying step of supplying a solvent to a center part of a substrate while increasing a rotation speed of the substrate. In the solvent supplying step, the solvent is successively supplied to the substrate until the solvent reaches a periphery edge of the substrate. With such a substrate treating method, the solvent is able to cover a substrate surface entirely with effective suppression of particles. In other words, a process of supplying the solvent to the substrate is performable with effectively improved quality.

18 Claims, 15 Drawing Sheets

(56) References Cited

U.S. PATENT DOCUMENTS

| | | | | |
|---|---|---|---|---|
| 2010/0209607 A1* | 8/2010 | Takayanagi | ............ | B05D 1/005 427/240 |
| 2011/0052807 A1 | 3/2011 | Ichino et al. | ................. | 427/240 |
| 2011/0312190 A1 | 12/2011 | Ichino et al. | ................. | 438/782 |
| 2012/0189773 A1* | 7/2012 | Tachibana | .............. | B05D 1/005 427/240 |
| 2013/0137034 A1* | 5/2013 | Fu | ............................. | G03F 7/16 430/270.1 |

FOREIGN PATENT DOCUMENTS

| | | |
|---|---|---|
| JP | 2002-175966 A | 6/2002 |
| JP | 2008-307488 A | 12/2008 |
| JP | 2010-207788 A | 9/2010 |
| JP | 2012-000589 | 1/2012 |
| KR | 10-199463 A | 1/1997 |
| KR | 10-2011-0022530 A | 3/2011 |

OTHER PUBLICATIONS

Office Action dated Sep. 10, 2018 in corresponding Korean Patent Application No. 10-2017-0103539.
Office Action dated Jan. 28, 2019 in corresponding Chinese Patent Application No. 201710710303.6.

* cited by examiner

FIRST SPEED V1

SECOND SPEED V2
(V2>V1)

THIRD SPEED V3
(V3>V2>V1)

SUBSTRATE TREATING METHOD

CROSS-REFERENCE TO RELATED APPLICATIONS

This application claims priority to Japanese Patent Application No. 2016-160612 filed Aug. 18, 2016, the disclosure of which is hereby incorporated herein by reference in its entirety for all purposes.

BACKGROUND OF THE INVENTION

Field of the Invention

The present invention relates to a substrate treating method for treating substrates. More particularly, the present invention is directed to a technique of supplying a solvent to substrates. Here, examples of the substrate include a semiconductor wafer, a glass substrate for photomask, a glass substrate for liquid crystal display, and an optical disk substrate.

Description of the Related Art

In a photo lithography process, a circuit pattern of a semiconductor device is transferred to a resist film on a substrate. The photo lithography process includes a process of forming a coating film, such as a resist film, on the substrate, and a process of developing the resist film.

In these processes, various types of processing liquids are supplied to the substrate. The processing liquids are, for example, a chemical and a solvent. Examples of the chemical include a coating liquid used for forming a coating film, such as a resist film, on the substrate, and a developing liquid used for developing the resist film Examples of the coating liquid include a resist film material used for forming the resist film. The solvent is, for example, thinner.

For instance, the solvent enhances wettability of the resist film material. The enhanced wettability of the resist film achieves suppressed consumption of the resist film material. See, for example, Patent Literatures 1 and 2. Alternatively, the enhanced wettability of the resist film achieves formation of the resist film of high quality on the substrate. See, for example, Patent Literatures 3 and 4.

In Japanese Unexamined Patent Application Publication No. 2002-134399A, thinner is supplied to a substrate at rest. After the thinner is supplied, a rotation speed of the substrate increases rapidly to 4000 rpm while a resist film material is supplied to the substrate. This causes the solvent and the resist film material to spread over a surface of the substrate to form a resist film on the substrate.

In Japanese Unexamined Patent Application Publication No. 2010-207788A, thinner is supplied to a substrate having a maintained rotation speed of 0 to 50 rpm. After the thinner is supplied, the rotation speed of the substrate increases rapidly to 2000 to 4000 rpm while a resist film material is supplied to the substrate. This causes the solvent and the resist film material to spread over a surface of the substrate to form a resist film on the substrate.

In Japanese Unexamined Patent Application Publication No. 2002-175966A, thinner is dropped onto a substrate at rest. After the thinner is dropped, the substrate is rotated to cause the thinner to spread over a surface of the substrate, whereby a film of the thinner is formed on the surface of the substrate. Thereafter, a resist film material is supplied to the substrate. This achieves formation of the resist film on the substrate.

In Japanese Unexamined Patent Application Publication No. 2012-589A, a solvent is supplied to a substrate at rest. After the solvent is supplied, a rotation speed of the substrate increases rapidly to 500 rpm to cause the solvent to spread over a surface of the substrate. Thereafter, a resist film material is supplied to the substrate. This achieves formation of the resist film on the substrate.

The solvent is not used only for enhancement of the wettability of the resist film material. For instance, the solvent is used for enhancing wettability of chemical other than the resist film material, for obtaining the substrate surface with high-degree conformability to the chemical, and for diluting the chemical. Moreover, the solvent is also used for modifying the substrate surface and for enhancing wettability of the substrate surface.

SUMMARY OF THE INVENTION

In recent years, the following possibility has occurred. That is, minute particles, which were not previously problematical, may lead to a pattern defect as resist patterns are micronized. Moreover, improved accuracy of inspecting quality of processes causes detection of particles which were previously overlooked. Such situations make it problematic to generate minute particles in the process of supplying the processing liquid to the substrate.

The present invention has been made regarding the state of the art noted above, and its one object is to provide a substrate treating method that allows more improved quality of processes.

Inventors of the present invention have considered that the generation of particles results from the way to supply the chemical to the substrate. Typically, a chemical has wettability worse (lower) than a solvent, or a viscosity higher than a solvent. Accordingly, it is more difficult to supply the chemical to the substrate appropriately than to supply the solvent to the substrate appropriately.

The Inventors have attempted to change procedures and conditions of supplying the chemical to the substrate. However, any change in procedure and condition of supplying the chemical to the substrate leads to an impossibility of suppressing generation of particles effectively.

Then, another consideration about a generation situation of particles was made by the Inventors to reveal that many particles are distributed along a circumference of a small imaginary circle located at a center part of the substrate. In addition, the Inventors have found that the imaginary circle is similar to an area of a solvent pool that is formed temporarily upon supplying the solvent to the substrate. Then, the Inventors have considered that the particles result from the way to supply the solvent to the substrate.

Here, the "solvent pool" corresponds to lumps of the solvent. In the present specification, the "solvent pool" is referred to as a "core of the solvent" as appropriately.

The Inventors have attempted to change procedures and conditions of supplying the solvent to the substrate.

The present invention has been made through the above finding, consideration, and attempt and thus is constituted as stated below. That is, one aspect of the present invention provides a substrate treating method for treating a substrate. The substrate treating method includes a solvent supplying step of supplying a solvent at a center part of the substrate while increasing a rotation speed of the substrate. In the solvent supplying step, the solvent is successively supplied to the substrate until the solvent reaches a periphery edge of the substrate.

The substrate treating method according to the aspect of the present invention includes a solvent supplying step. In the solvent supplying step, the solvent is supplied to the center part of the substrate, whereby one core of the solvent is formed at the center part of the substrate. In the solvent supplying step, the core of the solvent spreads by increasing a rotation speed of the substrate. In the solvent supplying step, the solvent is continuously supplied to the substrate from when the solvent starts to be supplied to the substrate until when the solvent reaches the periphery edge of the substrate. This allows smooth expansion of the core of the solvent until the solvent reaches the periphery edge of the substrate. As a result, the solvent is able to cover the entire substrate surface with effective suppression of particles. In other words, the process of supplying the solvent to the substrate is performable with effectively improved quality.

Here, "the center part of the substrate" corresponds to a part of the substrate surface containing the rotation center of the substrate. In addition, the "substrate surface" means a top face of the substrate. A position where the solvent is supplied is not always necessary to be the center part of the substrate while the solvent is successively supplied to the substrate. For instance, a position where the solvent is supplied may be shifted from the center part of the substrate to a region other than the center part of the substrate while the solvent is successively supplied to the substrate. Here, "increasing the rotation speed of the substrate" means that the rotation speed of the substrate upon completion of the solvent supplying step is higher than that upon start of the solvent supplying step, and that the rotation speed of the substrate never decreases during a period from the start to the completion of the solvent supplying step. For instance, the rotation speed of the substrate may successively increase over the entire period of the solvent supplying step. Alternatively, the period of the solvent supplying step may include a first period during which the rotation speed of the substrate increases and a second period during which the rotation speed of the substrate is kept constant.

It is preferred in the aspect of the substrate treating method that the solvent supplying step further includes a first constant speed step of maintaining the rotation speed of the substrate at a first speed while the solvent is supplied to the substrate, and a first accelerating step of increasing the rotation speed of the substrate from the first speed to a second speed, higher than the first speed, subsequent to the first constant speed step while the solvent is successively supplied to the substrate, and that the first accelerating step starts before the solvent reaches the periphery edge of the substrate. Since the solvent supplying step includes the first constant speed step, the core of the solvent is suitably formable on the substrate. In addition, since the solvent supplying step includes the first accelerating step, centrifugal force acting on the solvent is positively increasable before the solvent reaches the periphery edge of the substrate. This achieves smooth expansion of the core of the solvent.

It is preferred in the aspect of the substrate treating method that the solvent supplying step further includes a second constant speed step of maintaining the rotation speed of the substrate at the second speed subsequent to the first accelerating step while the solvent is successively supplied to the substrate, and that the second constant speed step starts before the solvent reaches the periphery edge of the substrate. In the solvent supplying step, at least two constant speed steps (i.e., the first constant speed step and the second constant speed step) are performed during a period from when the solvent starts to be supplied to the substrate until when the solvent reaches the periphery edge of the substrate. In the solvent supplying step, the rotation speed of the substrate increases in a stepwise manner until the solvent reaches the periphery edge of the substrate. This achieves more smooth expansion of the core of the solvent.

In is preferred in the aspect of the substrate treating method that the solvent supplying step further includes a second accelerating step of increasing the rotation speed of the substrate from the second speed to a third speed, higher than the second speed, subsequent to the second constant speed step while the solvent is successively supplied to the substrate, and that the second accelerating step starts before the solvent reaches the periphery edge of the substrate. In the solvent supplying step, at least two accelerating steps (i.e., the first accelerating step and the second accelerating step) are performed during a period from when the solvent starts to be supplied to the substrate until when the solvent reaches the periphery edge of the substrate. In the solvent supplying step, the centrifugal force acting on the solvent positively increases at two or more times until the solvent reaches the periphery edge of the substrate. This achieves more smooth expansion of the core of the solvent.

It is preferred in the aspect of the substrate treating method that the solvent supplying step further includes a third constant speed step of maintaining the rotation speed of the substrate at the third speed subsequent to the second accelerating step while the solvent is successively supplied to the substrate, and that the third constant speed step starts before the solvent reaches the periphery edge of the substrate. In the solvent supplying step, at least three constant speed steps (i.e., the first constant speed step, the second constant speed step, and the third constant speed step) are performed during a period from when the solvent starts to be supplied to the substrate until when the solvent reaches the periphery edge of the substrate. In the solvent supplying step, the rotation speed of the substrate increases by three or more stages until the solvent reaches the periphery edge of the substrate. This achieves more smooth expansion of the core of the solvent.

It is preferred in the aspect of the substrate treating method that the first speed is 0 rpm or more and less than 30 rpm. Since the first speed is relatively low, more suitable formation of the core of the solvent is obtainable.

Another aspect of the present invention provides a substrate treating method for treating the substrate, the substrate treating method including a solvent supplying step of supplying a solvent to a center part of the substrate while increasing a rotation speed of the substrate. In the solvent supplying step, the rotation speed of the substrate increases by three or more stages during a period from when the solvent starts to be supplied to the substrate until when the solvent reaches a periphery edge of the substrate.

The substrate treating method according to the aspect of the present invention includes the solvent supplying step. The solvent supplying step supplies the solvent to the center part of the substrate, thereby forming only one core of the solvent at the center part of the substrate. In the solvent supplying step, the rotation speed of the substrate increases, whereby the core of the solvent spreads over the substrate. Here in the solvent supplying step, the rotation speed of the substrate increases by at least three stages during a period from when the solvent starts to be supplied to the substrate until when the solvent reaches the periphery edge of the substrate. This achieves smooth expansion of the core of the solvent until when the solvent reaches the periphery edge of the substrate. As a result, the solvent is able to cover the entire substrate surface with effective suppression of particles. In other words, a process of supplying the solvent to the substrate is performable with effectively improved quality.

Here, the rotation speeds of the substrate differ from one another in the "at least three stages", and they are each kept constant.

It is preferred in the aspect of the substrate treating method that the solvent supplying step further includes a first constant speed step of maintaining the rotation speed of the substrate at a first speed while the solvent is supplied to the substrate, a second constant speed step of maintaining the rotation speed of the substrate at a second speed, higher than the first speed, subsequent to the first constant speed step, and a third constant speed step of maintaining the rotation speed of the substrate at a third speed, higher than the second speed, subsequent to the second constant speed step, and that the third constant speed step starts before the solvent reaches the periphery edge of the substrate. In the solvent supplying step, at least three constant speed steps (i.e., the first constant speed step, the second constant speed step, and third constant speed step) are performed during a period from when the solvent starts to be supplied to the substrate until when the solvent reaches the periphery edge of the substrate. In other words, the solvent supplying step increases the rotation speed of the substrate by three or more stages until the solvent reaches the periphery edge of the substrate. This achieves more smooth expansion of the core of the solvent.

Here, the first to third constant speed steps are one example of the "at least three stages" in the above-mentioned substrate treating method.

It is preferred in the aspect of the substrate treating method that the first speed is 0 rpm or more and less than 30 rpm. Since the first speed is relatively low, more suitable formation of the core of the solvent is obtainable.

Another aspect of the present invention provides a substrate treating method for treating the substrate, the substrate treating method including a solvent supplying step of supplying a solvent to a center part of the substrate while increasing a rotation speed of the substrate. In the solvent supplying step, the rotation speed of the substrate increases successively during a period from when the solvent starts to be supplied to the substrate until when the solvent reaches a periphery edge of the substrate.

The substrate treating method according to the aspect of the present invention includes the solvent supplying step. In the solvent supplying step, the solvent is supplied to the center part of the substrate, whereby one core of the solvent is temporarily formed at the center part of the substrate. In the solvent supplying step, the rotation speed of the substrate increases, whereby the core of the solvent expands. Here in the solvent supplying step, the rotation speed of the substrate increases successively during a period from when the solvent starts to be supplied to the substrate until when the solvent reaches the periphery edge of the substrate. This achieves smooth expansion of the core of the solvent until the solvent reaches the periphery edge of the substrate. As a result, the solvent is able to cover the entire substrate surface with effective suppression of particles. In other words, a process of supplying the solvent to the substrate is performable with effectively improved quality.

It is preferred in the aspect of the substrate treating method that, in the solvent supplying step, the solvent is supplied to the substrate successively until the solvent reaches the periphery edge of the substrate. The solvent supplying step supplies the solvent to the substrate continuously during a period from when the solvent starts to be supplied to the substrate until when the solvent reaches the periphery edge of the substrate. This achieves more smooth expansion of the core of the solvent until the solvent reaches the periphery edge of the substrate.

It is preferred in the aspect of the substrate treating method that the rotation speed of the substrate when the solvent reaches the periphery edge of the substrate is less than 1500 rpm. In other words, it is preferred that the rotation speed of the substrate is restricted to less than 1500 rpm during a period from when the solvent starts to be supplied to the substrate until when the solvent reaches the periphery edge of the substrate. This achieves more smooth expansion of the core of the solvent.

It is preferred in the aspect of the substrate treating method that the rotation speed of the substrate when the solvent reaches the periphery edge of the substrate is less than 200 rpm. In other words, it is preferred that the rotation speed of the substrate is restricted to an extent of less than 200 rpm during a period from when the solvent starts to be supplied to the substrate until when the solvent reaches the periphery edge of the substrate. This achieves more smooth expansion of the core of the solvent.

It is preferred in the aspect of the substrate treating method that, in the solvent supplying step, the rotation speed of the substrate increases in an S-shaped manner during at least a part of a period from when the solvent starts to be supplied to the substrate until when the solvent reaches the periphery edge of the substrate. Increase in rotation speed of the substrate in the S-shaped manner allows a slow variation in rotational acceleration of the substrate. That is, a slow variation of the centrifugal force acting on the solvent on the substrate is obtainable. This achieves more smooth expansion of the core of the solvent.

Here, the terms "the rotation speed of the substrate increases in the S-shaped manner" includes increase in rotational acceleration of the substrate with the lapse of time when the rotation speed of the substrate starts to increase. Moreover, the terms "the rotation speed of the substrate increases in the S-shaped manner" includes decrease in rotational acceleration of the substrate with the lapse of time when the rotation speed of the substrate stops increasing.

It is preferred that the substrate treating method further includes a chemical supplying step of supplying a chemical to the substrate after supply of the solvent to the substrate is completed. The chemical supplying step is performed after the solvent is supplied to the substrate with high quality. This also leads to a process of supplying the chemical to the substrate with high quality.

It is preferred that the substrate treating method further includes a simple rotation step of rotating the substrate without supplying any processing liquid to the substrate after supply of the solvent to the substrate is completed. This achieves a suitably thinned film of the solvent on the substrate.

The present specification also discloses aspects of the substrate treating method as under.

(1) Disclosed is a substrate treating method for treating a substrate. The method includes a step of generating a core of a solvent at a center part of the substrate through start of supply of the solvent to the center part of the substrate; and a step of expanding the core of the solvent while an edge of the core of the solvent contacts the substrate by successively supplying the solvent to the substrate and increasing a rotation speed of the substrate slowly.

In the substrate treating method according to the above description (1), the solvent is continuously supplied to the substrate. As a result, the edge of the core of the solvent may keep contacted to the surface of the substrate suitably when the core of the solvent expands. Moreover, in the substrate treating method according to the description (1), the rotation speed of the substrate increases slowly. Accordingly, the edge of the core of the solvent may keep contacted to the surface of the substrate more suitably when the core of the solvent expands. This achieves expansion of the core of the solvent without catching any air bubbles. Consequently, effective suppression of particles is obtainable. In other words, a process of supplying the solvent to the substrate is performable with effectively improved quality.

(2) In the above-mentioned substrate treating method, the solvent is supplied to the center part of the substrate when the supply of the solvent to the substrate starts.

With the substrate treating method according to the above description (2), suitable generation of the core of the solvent is obtainable at the center part of the substrate.

(3) In the above-mentioned substrate treating method, the solvent is supplied only to the center part of the substrate.

With the substrate treating method according to the above description (3), the solvent is supplied only to the center part of the surface of the substrate when the solvent is supplied to the substrate. This achieves more smooth expansion of the core of the solvent.

(4) In the above-mentioned substrate treating method, the solvent starts to be supplied to the center part of the substrate in the first constant speed step.

With the substrate treating method according to the above description (4), the first constant speed step allows suitable generation of the core of the solvent at the center part of the substrate.

(5) In the above-mentioned substrate treating method, the solvent supplying step includes a third accelerating step of increasing rotation speed of the substrate from the third speed while the solvent is successively supplied to the substrate subsequent to the third constant speed step, and the third accelerating step starts before the solvent reaches the periphery edge of the substrate.

With the substrate treating method according to the above description (5), the solvent supplying step performs at least three accelerating steps (i.e., the first accelerating step, the second accelerating step, and the third accelerating step) during a period from when the solvent starts to be supplied to the substrate until when the solvent reaches the periphery edge of the substrate. In the solvent supplying step, the centrifugal force acting on the solvent positively increases at three or more times until the solvent reaches the periphery edge of the substrate. This achieves more smooth expansion of the core of the solvent.

(6) In the above-mentioned substrate treating method, the solvent supplying step includes a pre-accelerating step of increasing the rotation speed of the substrate to the first speed.

With the substrate treating method according to the above description (6), the solvent supplying step includes the pre-accelerating step. This allows suitable preparation of the first constant speed step.

(7) In the substrate treating method according to the above description (6), the first speed is more than 0 rpm and less than 30 rpm.

With the substrate treating method according to the above description (7), the first speed is relatively low, leading to more suitable formation of the core of the solvent.

(8) In the substrate treating method according to the above description (6) or (7), the solvent is supplied to the substrate in the pre-accelerating step.

With the substrate treating method according to the above description (8), suitable formation of the core of the solvent on the substrate is obtainable in the pre-accelerating step.

(9) In the substrate treating method according to any of the above descriptions (6) to (8), the solvent starts to be supplied to the center part of the substrate in the pre-accelerating step.

With the substrate treating method according to the description (9), suitable generation of the core of the solvent at the center part of the substrate is obtainable in the pre-accelerating step.

(10) In the substrate treating method, the rotation speed of the substrate increases successively during a period from when the solvent starts to be supplied to the substrate until when the solvent reaches the periphery edge of the substrate in the solvent supplying step.

With the substrate treating method according to the description (10), smooth expansion of the core of the solvent is obtainable.

(11) In the above-mentioned substrate treating method, the rotation speed of the substrate is more than 0 rpm and less than 30 rpm when the solvent starts to be supplied to the substrate.

With the substrate treating method according to the description (11), the rotation speed of the substrate is relatively low when the solvent starts to be supplied to the substrate. Accordingly, more suitable generation of the core of the solvent on the substrate is obtainable.

(12) Another aspect of the present invention provides a substrate treating method for treating a substrate, the substrate treating method including a solvent supplying step of supplying a solvent to a center part of the substrate while a rotation speed of the substrate increases. The solvent supplying step restricts the rotation speed of the substrate to an extent of less than 200 rpm during a period from when the solvent starts to be supplied to the substrate until when the solvent reaches the periphery edge of the substrate.

The substrate treating method according to the description (12) includes the solvent supplying step. In the solvent supplying step, one core of the solvent is temporarily formed at the center part of the substrate by supplying the solvent to the center part of the substrate. In the solvent supplying step, the core of the solvent expands through increase in rotation speed of the substrate. Here, in the solvent supplying step, the rotation speed of the substrate is restricted to an extent of less than 200 rpm from when the solvent starts to be supplied to the substrate until when the solvent reaches the periphery edge of the substrate. This allows smooth expansion of the core of the solvent until when the solvent reaches the periphery edge of the substrate. As a result, the solvent is able to cover the entire substrate surface with effective suppression of particles. In other words, a process of supplying the solvent to the substrate is performable with effectively improved quality.

(13) The above-mentioned substrate treating method further includes a simple rotation step of rotating the substrate without supplying any processing liquid to the substrate after the solvent supplying step, and a chemical supplying step of supplying a chemical to the substrate after the simple rotation step.

The substrate treating method according to the description (13) includes the simple rotation step. This achieves a suitably thinned film of the solvent on the substrate. In addition, the substrate treating method includes the chemical supplying step. This allows improved quality of not only supplying the solvent to the substrate but also supplying the chemical to the substrate.

(14) In the above substrate treating method, the chemical starts to be supplied to the substrate when the supply of the solvent to the substrate is completed.

With the substrate treating method according to the description (14), the chemical is able to be supplied to the substrate before the solvent on the substrate is dried. This leads to more smooth spread of the chemical over the substrate. Accordingly, a process of supplying the chemical to the substrate is suitably performable with improved quality.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

DESCRIPTION OF EMBODIMENTS

Figure 1:
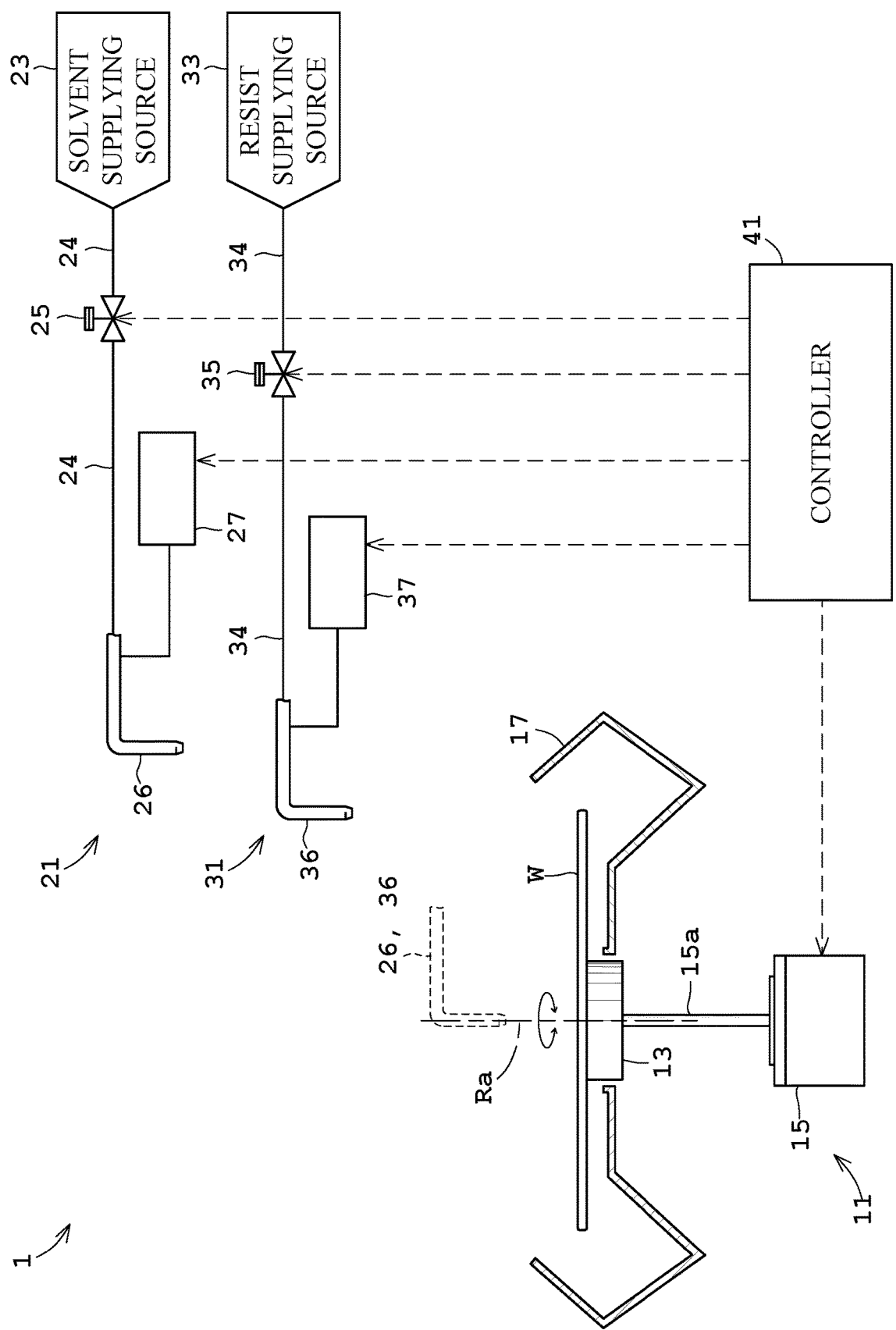
FIG. 1 schematically illustrates a substrate treating apparatus according to one embodiment.

The following describes embodiments of the present invention with reference to drawings. FIG. 1 schematically illustrates a substrate treating apparatus according to one embodiment.

A substrate treating apparatus 1 supplies processing liquids to a substrate (e.g., semiconductor wafer) W. Here, the processing liquids are, for example, a solvent and a chemical. The chemical is a coating liquid, for example, that forms a coating film on the substrate W. The coating liquid is, for example, a resist film material (hereinafter, referred to as a "resist" appropriately).

The substrate treating apparatus 1 includes a spin holder 11 that holds the substrate W rotatably. The spin holder 11 includes a spin chuck 13 and a motor 15. The spin chuck 13 holds the substrate W in a substantially horizontal attitude. More specifically, the spin chuck 13 suction-holds a center part of a backside of the substrate W. The spin chuck 13 has a lower part connected to a tip end of an output shaft 15a of the motor 15. The output shaft 15a extends substantially vertically. The motor 15 rotates the output shaft 15a, whereby the spin chuck 13 rotates integrally with the substrate W. Here, the output shaft 15a has an axis corresponding to a rotation center Ra of the substrate W. The rotation center Ra of the substrate W passes through the center part of a top face of the substrate W substantially orthogonally relative to the top face of the substrate W. Hereunder, the top face of the substrate W is referred to as a "surface of the substrate W" as appropriately.

The substrate treating apparatus 1 includes a scatter preventive cup 17 surrounding the spin chuck 13. The scatter preventive cup 17 receives and collects the processing liquids (i.e., the chemical, the solvent, and the like) scattering from the substrate W.

The substrate treating apparatus 1 includes a solvent supplying unit 21 that supplies the solvent. The solvent supplying unit 21 includes a solvent supplying source 23, a pipe 24, an open/close valve 25, a nozzle 26, and a moving mechanism 27. The solvent supplying source 23 stores the solvent. The solvent supplying source 23 is in communication with a first end of the pipe 24. The open/close valve 25 is disposed on the pipe 24. The open/close valve 25 opens/closes a flow path of the solvent in the pipe 24. The nozzle 26 is in communication with a second end of the pipe 24. The nozzle 26 dispenses the solvent. The moving mechanism 27 moves the nozzle 26. Specifically, the moving mechanism 27 moves the nozzle 26 between a treatment position above the center part of the surface of the substrate W and a retracted position away from the above of the substrate W. FIG. 1 illustrates the nozzle 26 in the retracted position by solid lines as well as the nozzle 26 in the treatment position by broken lines.

The solvent is, for example, hydrophilic. The solvent has higher wettability than the resist. The solvent has lower viscosity than the resist. The solvent is, for example, an organic solvent. Examples of the solvent include thinner, propylene glycol monomethyl ether acetate (PGMEA), emulsifying ethyl, and isopropyl alcohol (IPA).

The substrate treating apparatus 1 includes a resist supplying unit 31 that supplies the resist. The resist supplying unit 31 includes a resist supplying source 33, a pipe 34, an open/close valve 35, a nozzle 36, and a moving mechanism 37. The resist supplying source 33 stores the resist. The resist supplying source 33 is in communication with a first end of the pipe 34. The open/close valve 35 is disposed on the pipe 34. The open/close valve 35 opens/closes a flow path of the resist in the pipe 34. The nozzle 36 is in communication with a second end of the pipe 34. The nozzle 36 dispenses the resist. The moving mechanism 37 moves the nozzle 36. Specifically, the moving mechanism 37 moves the nozzle 36 between the treatment position above the center part of the substrate W and the retracted position away from the above of the substrate W. FIG. 1 illustrates the nozzle 36 in the retracted position by solid lines as well as the nozzle 36 in the treatment position by broken lines.

The substrate treating apparatus 1 includes a controller 41 that operates en bloc each of the elements mentioned above. Specifically, the controller 41 controls the motor 15 to adjust a rotation speed (number of rotations) of the substrate W. The controller 41 controls the moving mechanisms 27 and 37 to move the nozzles 26 and 36, respectively. The controller 41 controls the open/close valves 25 and 35 to switch between supply and stop of the supply of the solvent and the resist, respectively.

The controller 41 contains processing recipes and the like with pre-set processing conditions for treating the substrate W. Here, examples of the processing condition include information on a relationship between the rotation speed of the substrate W and time, a relationship between rotational acceleration of the substrate W and time, and a relationship between supply of the processing liquids and time. The controller 41 is implemented by a central processing unit (CPU) that performs various processes, a RAM (Random-Access Memory) as a workspace of arithmetic processing, and a storage medium such as a fixed disk that stores various types of information.

The following describes a plurality of substrate treating methods (processing examples) executed by the substrate treating apparatus 1 according to the embodiment.

Processing Example 1

Figure 2:
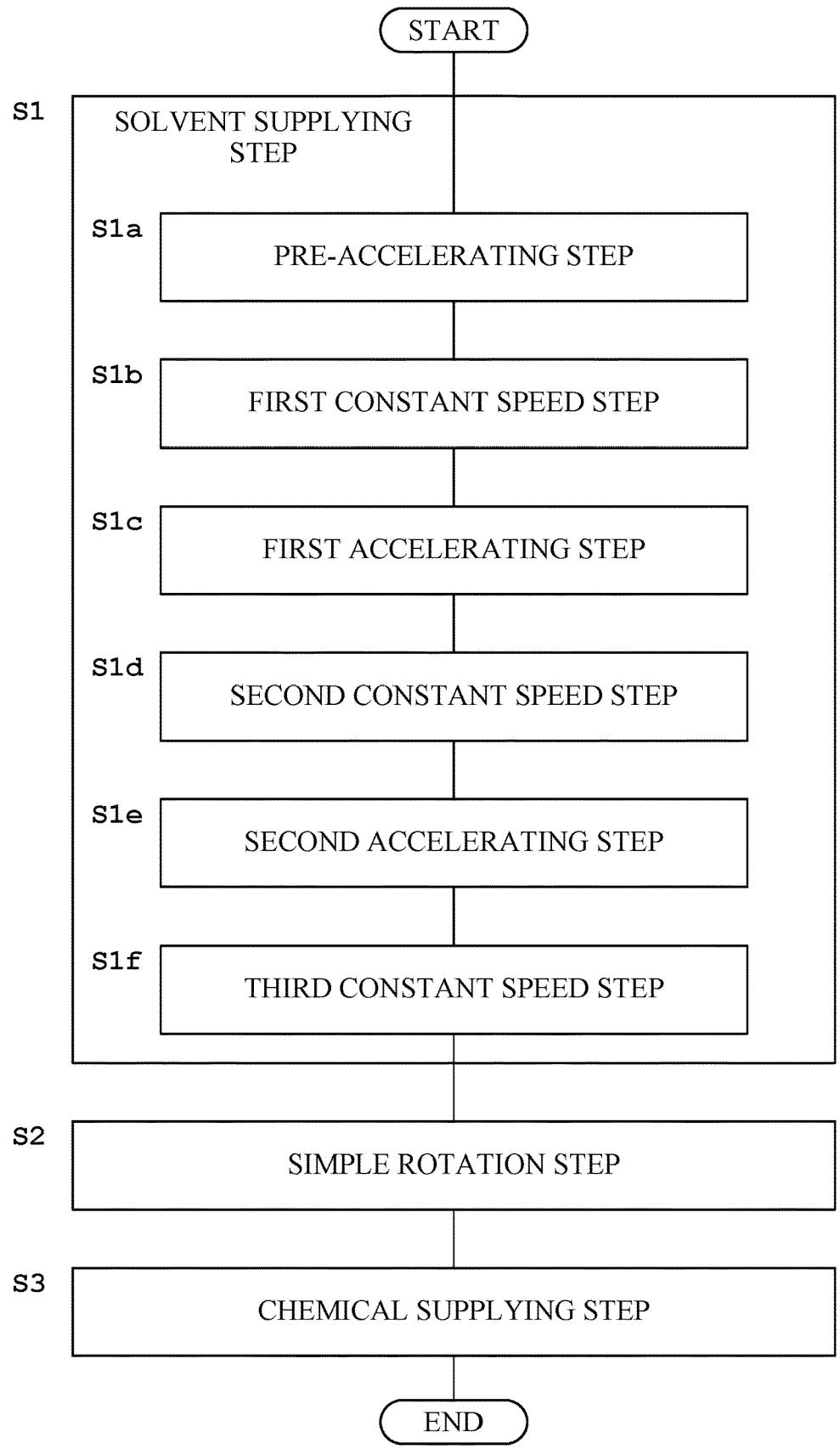
FIG. 2 is a flow chart of procedures in a processing example 1.

FIG. 2 is a flow chart illustrating procedures in a processing example 1. The processing example 1 includes a solvent supplying step (Step S1), a simple rotation step (Step S2), and a chemical supplying step (Step S3). The processing example 1 firstly performs the solvent supplying step. The processing example 1 performs the simple rotation step after the solvent supplying step. The processing example 1 performs the chemical supplying step after the simple rotation step. In the solvent supplying step, the solvent is supplied to the substrate W. Moreover, the solvent supplying step includes six processes (Steps S1a to S1f). In the simple rotation step, the substrate W simply rotates without supplying any processing liquid to the substrate W. In the chemical supplying step, the resist is supplied to the substrate W. Here, the solvent supplying step is also referred to as "pre-wet".

Figure 3:
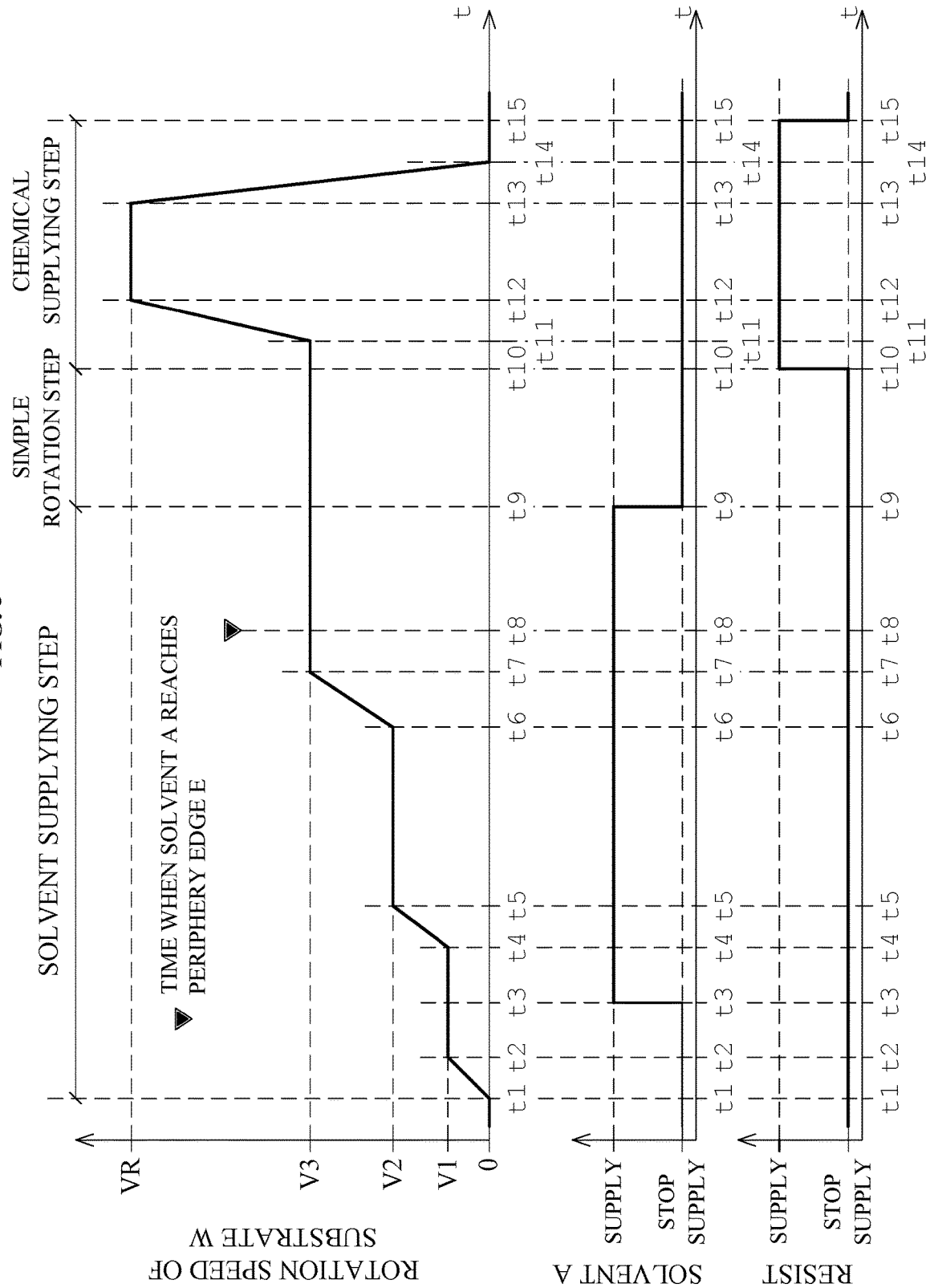
FIG. 3 is a timing chart of procedures in the processing example 1.

FIG. 3 is a timing chart of the procedures in the processing example 1. Now detailed description of the above steps is made with reference to FIG. 3. In the following description, it is assumed that the substrate W is held with the spin holder 11 substantially horizontally. In addition, it is assumed that the rotation speed of the substrate W is zero (0 rpm), and thus the substrate W is at rest. Moreover, it is assumed that the nozzles 26 and 36 are each in the retracted position, and the open/close valves 25 and 35 are each closed.

<Step S1>

The solvent supplying step performs the following processes (Steps S1a-S1f) in turn. The following describes each of the processes.

<Step S1a> Pre-Accelerating Step (Time t1 to t2)

The controller 41 controls the motor 15 to increase a rotation speed of the substrate W from 0 rpm to a first speed V1 during a period of time t1 to t2.

It is preferred that the first speed V1 is higher than 0 rpm and lower than 30 rpm.

The first speed V1 is, for example, 10 rpm. The period of time t1 to t2 is, for example, 0.1 seconds. For instance, rotational acceleration of the substrate W during the period of time t1 to t2 is constant. The rotational acceleration of the substrate W during the period of time t1 to t2 is, for example, 100 rpm/s. In other words, in the pre-accelerating step, the rotation speed of the substrate W increases for 0.1 seconds at the rotational acceleration of 100 rpm/s. As a result, the rotation speed of the substrate W increases from 0 to 10 rpm.

<Step S1b> First Constant Speed Step (Time t2 to t4)

The controller 41 controls the motor 15 to maintain the rotation speed of the substrate W at the first speed V1 during a period of time t2 to time t4. The controller 41 controls the moving mechanism 27 to move the nozzle 26 from the retracted position to the treatment position. The controller 41 performs control to open the open/close valve 25 to dispense the solvent from the nozzle 26. As a result, the solvent starts to be supplied to the center part of the surface of the substrate W at time t3.

The period between the time t2 to t4 is, for example, 2 seconds.

Figure 4A:
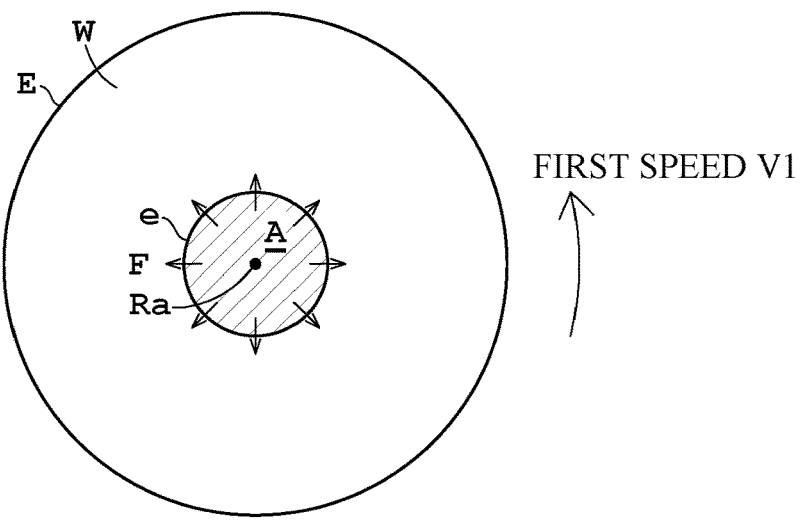
FIGS. 4A to 4C each illustrate a plan view of a solvent on a substrate.

FIG. 4A is a plan view illustrating the solvent on the substrate W in the first constant speed step. More specifically, FIG. 4A is a plan view of the solvent on the substrate W immediately after the solvent starts to be supplied to the substrate W. As illustrated, in the first constant speed step, one liquid pool of a solvent A is produced at the center part of the substrate W. Here, the liquid pool of the solvent A corresponds to lumps of the solvent A. Hereinafter, the liquid pool of the solvent A is referred to as a "core of the solvent A" as appropriately. The core of the solvent A is circular in plan view. The core of the solvent A is smaller than the surface of the substrate W. In the first constant speed step, the solvent A does not reach a periphery edge E of the substrate W.

Since the substrate W rotates during the first constant speed step, a centrifugal force F acts on the core of the solvent A. The centrifugal force F acts in a direction farther from the rotation center Ra. The centrifugal force F causes the core of the solvent A to expand uniformly. More specifically, an edge e of the core of the solvent A runs toward the entire of the periphery edge E of the substrate W. Accordingly, the core of the solvent A is kept circular in plan view.

<Step S1c> First Accelerating Step (Time t4 to t5)

In a first accelerating step, the rotation speed of the substrate W increases from the first speed V1 to a second speed V2, higher than the first speed V1, during a period of time t4 to t5. Moreover, in the first accelerating step, the solvent A is successively supplied to the center part of the substrate W.

It is preferred that the second speed V2 is less than 1500 rpm. It is also preferred that the second speed V2 is less than 200 rpm.

The second speed V2 is, for example, 30 rpm. The period of time t4 to t5 is, for example, 0.5 seconds. For instance, rotational acceleration of the substrate W is constant during the period of time t4 to t5. The rotational acceleration of the substrate W during the period of time t4 to t5 is, for example, 40 rpm/s.

Since the rotation speed of the substrate W increases in the first accelerating step, the centrifugal force F acting on the core of the solvent A increases. Increase in centrifugal force F causes positive expansion of the core of the solvent A. Moreover, the increase in centrifugal force F triggers enhanced flowability of the core of the solvent A relative to the substrate W, leading to smooth expansion of the core of the solvent A. In addition, since the solvent A is successively supplied to the substrate W in the first accelerating step, the core of the solvent A expands more smoothly. Also in the first accelerating step, the core of the solvent A expands uniformly, and thus is kept circular in shape.

<Step S1d> Second Constant Speed Step (Time t5 to t6)

In a second constant speed step, the rotation speed of the substrate W is maintained at the second speed V2 during a period of time t5 to time t6. In the second constant speed step, the solvent A is successively supplied to the substrate W during the period of time t5 to time t6.

The period of time t5 to t6 is, for example, 3 seconds.

Figure 4B:
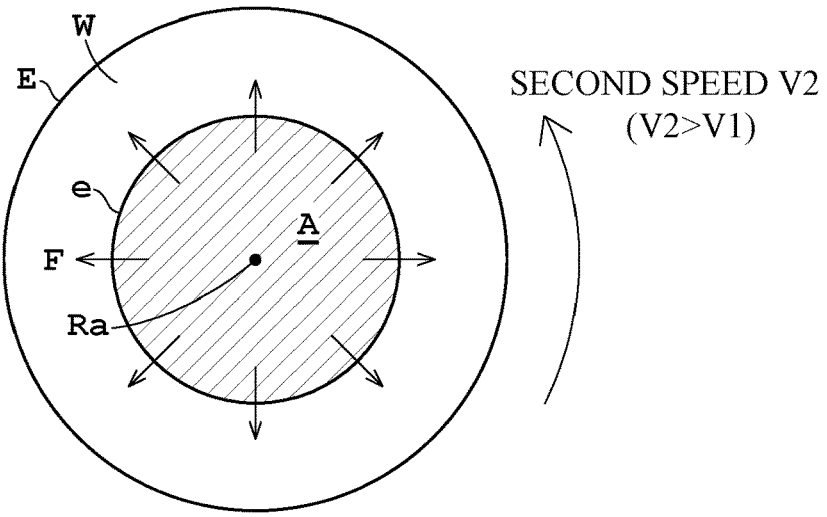

FIG. 4B is a plan view of the solvent A on the substrate W in the second constant speed step. The core of the solvent A in the second constant speed step is larger than that in the first constant speed step. Accordingly, the core of the solvent A becomes large with the lapse of time. However, the core of the solvent A does not reach the periphery edge E of the substrate W in the second constant speed step. Here, the second speed V2 is higher than the first speed V1. Consequently, the centrifugal force F acting on the core of the solvent A is higher in the second constant speed step than in the first constant speed step. Also in the second constant speed step, the core of the solvent A expands uniformly, and thus is kept circular in plan view.

<Step S1e> Second Accelerating Step (Time t6 to t7)

In a second accelerating step, the rotation speed of the substrate W increases from the second speed V2 to a third speed V3, higher than the second speed V2, during a period of time t6 to t7. In the second accelerating step, the solvent A is successively supplied to the center part of the substrate W.

It is preferred that the third speed V3 is less than 1500 rpm. It is more preferred that the third speed V3 is less than 200 rpm.

The third speed V3 is, for example, 100 rpm. The period of time t6 to t7 is, for example, 1.0 second. For instance, rotational acceleration of the substrate W is constant during the period of time t6 to t7. The rotational acceleration of the substrate W is, for example, 70 rpm/s during the period of time t6 to t7.

The centrifugal force F is higher in the second accelerating step than in the second constant speed step. Accordingly, the core of the solvent A expands again positively and smoothly. Moreover, in the second accelerating step, the solvent A is successively supplied to the substrate W. This allows more smooth expansion of the core of the solvent A. Thus, the core of the solvent A expands uniformly. In addition, the core of the solvent A is kept circular in plan view.

<Step S1f> Third Constant Speed Step (Time t7 to t9)

In a third constant speed step, the rotation speed of the substrate W is maintained at the third speed V3 during a period of time t7 to time t9. In the third constant speed step, the solvent A is successively supplied to the substrate W from the time t7 to the time t9. The solvent A reaches the periphery edge E of the substrate W at time t8 in the third constant speed step. Specifically, the edge e of the core of the solvent A reaches the periphery edge E of the substrate W.

The period of time t7 to t9 is, for example, 4 seconds.

Figure 4C:
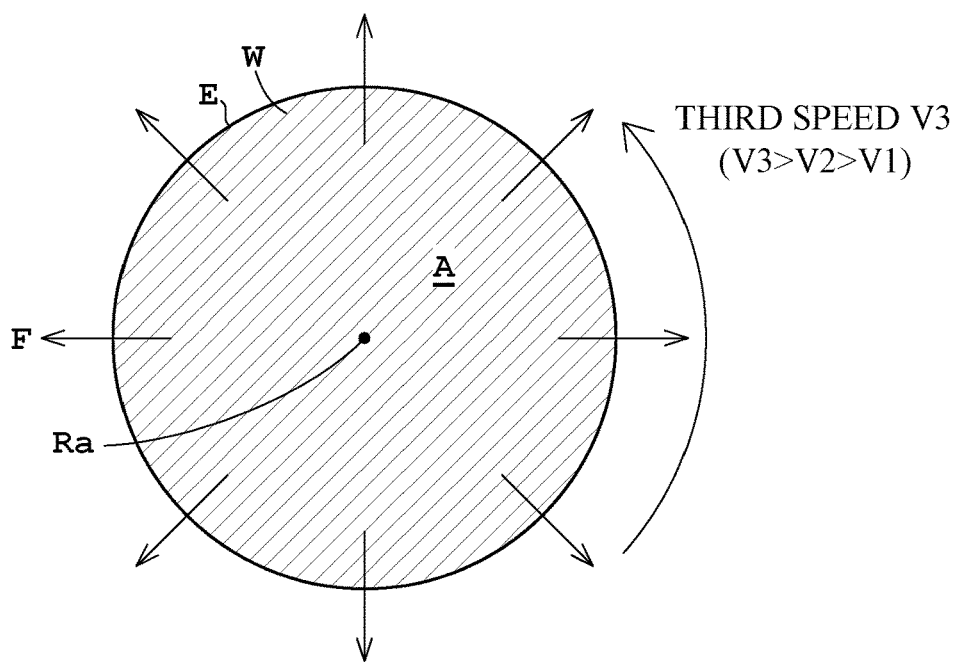

FIG. 4C is a plan view of the solvent A on the substrate W in the third constant speed step. More specifically, FIG. 4C is a plan view of the solvent A on the substrate W after the solvent A reaches the periphery edge E of the substrate W. As illustrated, the solvent A covers the surface of the substrate W entirely. A film of the solvent A is formed on the substrate W.

Subsequent to the time t8 when the solvent A reaches the periphery edge E of the substrate W, the solvent A on the substrate W is thrown out of the periphery edge E of the substrate W to scatter around the substrate W. The scattered solvent A is collected into the scatter preventive cup 17.

At the time t9, supply of the solvent A to the substrate W stops. Then, the controller 41 controls the moving mechanism 27 to move the nozzle 26 from the treatment position into the retracted position. This finishes the third constant speed step.

Along with the finish of the third constant speed step, the solvent supplying step is completed.

<Step S2> Simple Rotation Step (Time t9 to t10)

In a simple rotation step, the substrate W is rotated without supplying any processing liquid to the substrate W. More specifically, in the simple rotation step, the rotation speed of the substrate W is maintained at the third speed V3 during a period of time t9 to t10. The major portion of the solvent A on the substrate W is thrown out of the substrate W. This causes the thinned film of the solvent A on the substrate W.

<Step S3> Chemical Supplying Step (Time t10 to t15)

The controller 41 controls the moving mechanism 37 to move the nozzle 36 from the retracted position to the treatment position and controls to open the open/close valve 35 and dispense the resist from the nozzle 36. This causes start of supplying the resist to the substrate W at time t10. Such supply of the resist to the substrate W is continuously performed until time t15. The controller 41 increases/decreases the rotation speed of the substrate W during the period of time t10 to t15 in which the resist is supplied to the substrate W.

Specifically, the rotation speed of the substrate W is maintained at the third speed V3 during the period of time t10 to t11. During a period of time t11 to t12, the rotation speed of the substrate W increases from the third speed V3 to a speed VR which is higher than the third speed V3. During a period of time t12 to t13, the rotation speed of the substrate W is maintained at the speed VR. During a period of time t13 to t14, the rotation speed of the substrate W decreases from the speed VR to zero. During a period of time t14 to t15, the rotation speed of the substrate W is maintained zero.

The supply of the resist to the substrate W is finished at the time t15. Such a chemical supplying step achieves formation of a resist film on a surface of the substrate W.

The procedures in the processing example 1 are as above.

The following describes comparison between the processing example 1 and a comparative example about processing quality of supplying the solvent A to the substrate W while the comparative example is exemplified.

Figure 5:
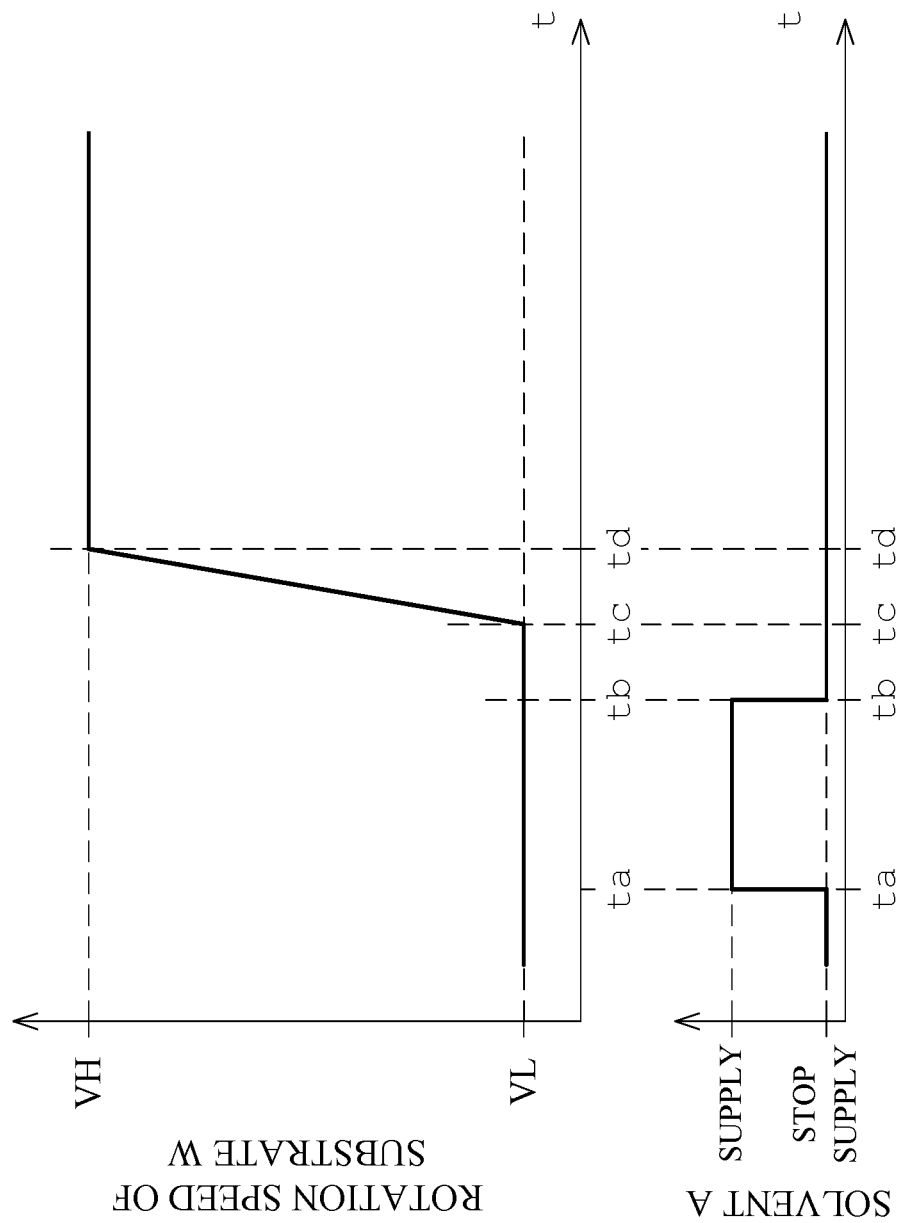
FIG. 5 is a timing chart of procedures of a substrate treating method according to a comparative example.

FIG. 5 is a timing chart of a substrate treating method according to a comparative example. In a comparative example 1, a rotation speed of the substrate W is maintained at a given low speed VL during a period of time ta to time tc. Here, the low speed VL is, for example, zero. Moreover, a solvent A starts to be supplied to the substrate W at the time ta. Accordingly, a core of the solvent A is generated on the substrate W. Then, supply of the solvent A to the substrate W is finished at the time tb.

The rotation speed of the substrate W rapidly increases from the low speed VL to a high speed VH during a period of time tc to time td. The high speed VH is relatively high. The high speed VH is, for example, in a range of several hundreds to several thousands rpm. Subsequent to the time td, the rotation speed of the substrate W is maintained at the high speed VH. The solvent A reaches a periphery edge E of the substrate W subsequent to the time tc.

Figure 6:
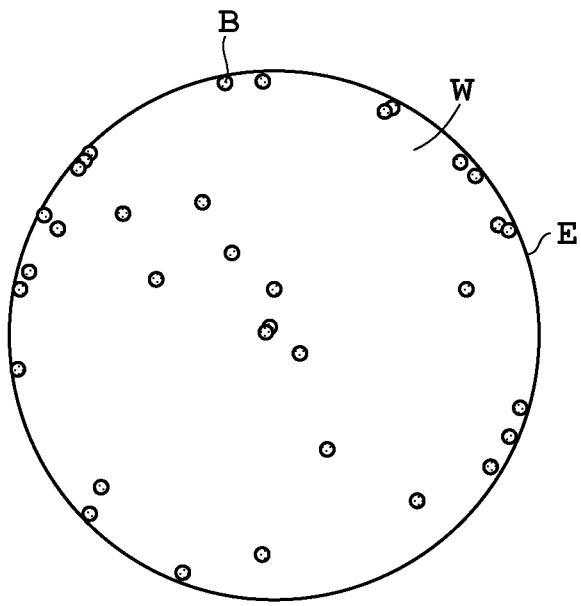
FIG. 6 illustrates a measurement result of particles on a substrate subjected to processes through the processing example 1.
Figure 7:
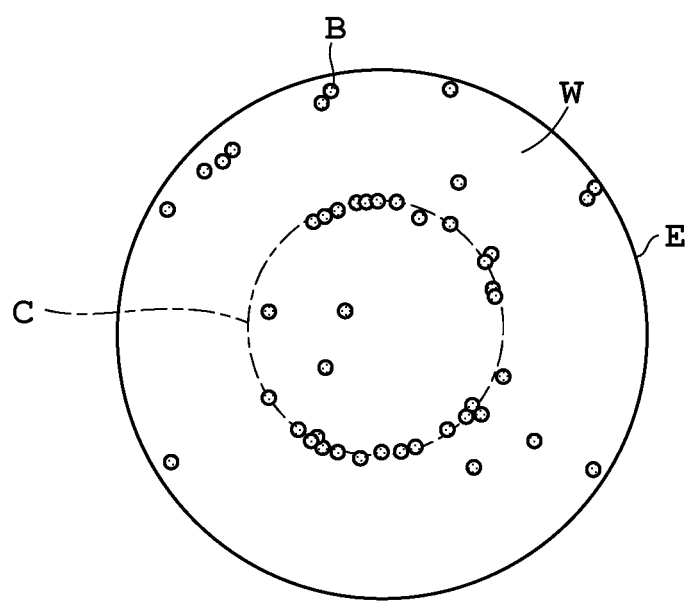
FIG. 7 illustrates a measurement result of particles on a substrate subjected to processes through the comparative example.

FIG. 6 illustrates a result of determining particles on the substrate W subjected to a process of supplying the solvent with the procedures of the processing example 1. Specifically, the result is obtained through determination of particles on the substrate W to which only the solvent supplying step and the simple rotation step of the processing example 1 are performed and the chemical supplying step is not performed. FIG. 7 illustrates a result of determining particles on the substrate W subjected to the process of supplying the solvent with the procedures in the comparative example. FIGS. 6 and 7 each illustrate detected positions of the particles on the substrate W in plan view.

In the processing example 1, 35 particles B are detected. In contrast to this, in the comparative example, 120 particles B are detected. As noted above, in the process of supplying the solvent A to the substrate W in the processing example 1, the number of particles B is restricted to one-third or less of that in the comparative example.

The Inventors have understood generation of the particles B as under.

FIGS. 8A to 8E each schematically illustrate behavior of the solvent A on the substrate W in the comparative example. FIGS. 8A to 8E each partially illustrate a sectional view of the substrate W in a vertical direction.

Figure 8A:
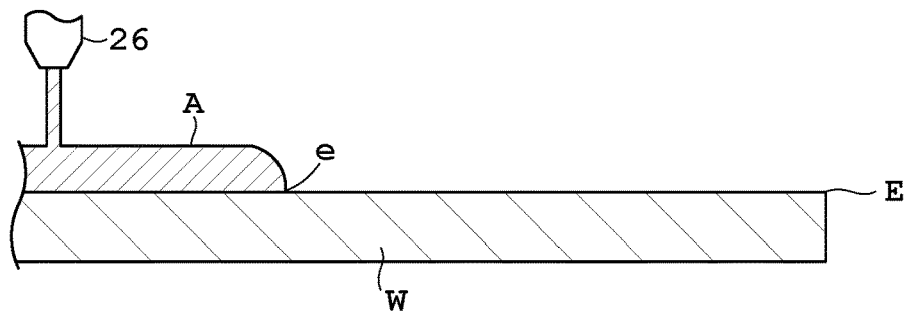
FIGS. 8A to 8E each schematically illustrate behavior of the solvent in the comparative example.
Figure 8B:
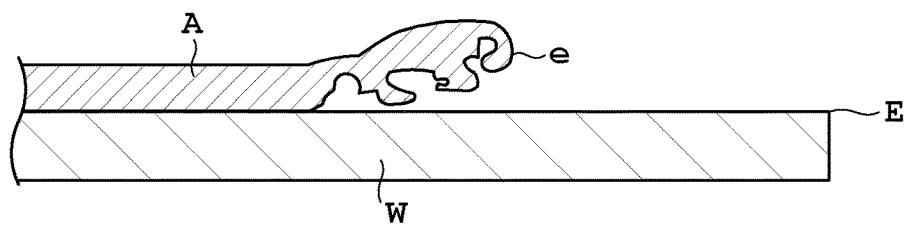
Figure 8C:
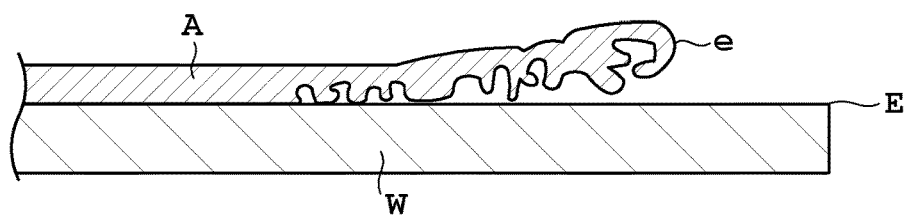
Figure 8D:
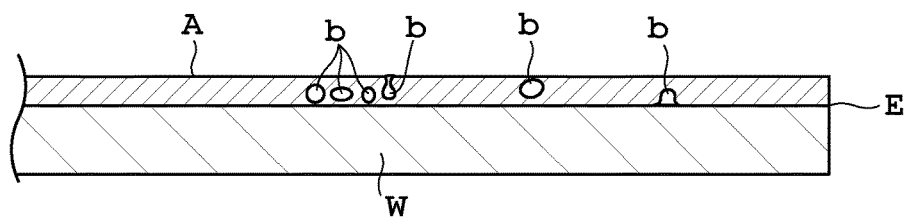
Figure 8E:
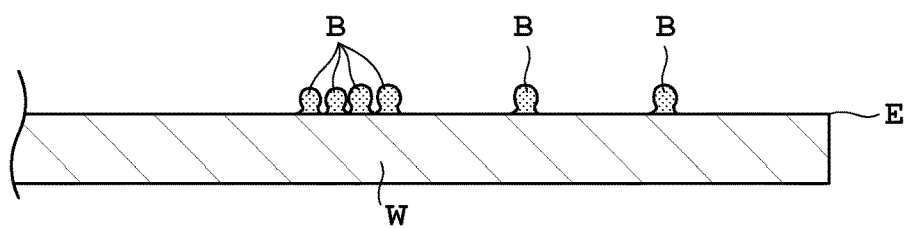

Firstly in the comparative example, the core of the solvent A is formed on the substrate W (see FIG. 8A). Secondary, the rotation speed of the substrate W increases from the low speed VL to the high speed VH. During increase in rotation speed of the substrate W, the core of the solvent A does not expand smoothly. More specifically, during the increase in rotation speed of the substrate W, the edge e of the core of the solvent A becomes irregular in shape (see FIGS. 8B and 8C). For instance, the edge e of the core of the solvent A floats up from the surface of the substrate W. For instance, the edge e of the core of the solvent A deforms in a zig-zag manner. Since the edge e extends with its irregular shape, the core of the solvent A catches air bubbles b (see FIG. 8D). The air bubbles b caught remains on the substrate W. The solvent A flows on the substrate W toward the periphery edge E of the substrate W, but the air bubbles b caught does not flow together with the solvent A. After the film of the solvent A is thinned or the solvent A is dried, traces of the air bubbles b become particles B (see FIG. 8E).

Some causes of the edge e in the irregular shape are considerable.

A first cause is that the rotation speed of the substrate W rapidly increases to the high speed VH. Immediately after the time tc in FIG. 5, the centrifugal force sharply increases. Accordingly, a relatively high centrifugal force suddenly acts on the core of the solvent A. This causes the edge e of the core of the solvent A in the irregular shape.

A second cause is that no solvent A is supplied to the substrate W while the core of the solvent A expands. That is, the solvent A is not supplied to the substrate W successively. Accordingly, the core of the solvent A becomes thinner as the core of the solvent A expands. Then, the edge e of the core of the solvent A is unlikely to extend on the substrate W smoothly as the core of the solvent A expands. This causes the edge e of the core of the solvent A in the irregular shape.

Reference is made to FIG. 7. In the comparative example, many particles B are distributed on an imaginary circle C disposed at the center part of the substrate W. This means that the edge e of the core of the solvent A becomes irregular in shape and the core of the solvent A catches many air bubbles b immediately after increase in rotation speed of the substrate W (i.e., immediately after the time tc).

FIGS. 9A to 9D each schematically illustrate behavior of the solvent A on the substrate W in the processing example 1. FIGS. 9A to 9D each partially illustrate a sectional view of the substrate W in a vertical direction.

Figure 9A:
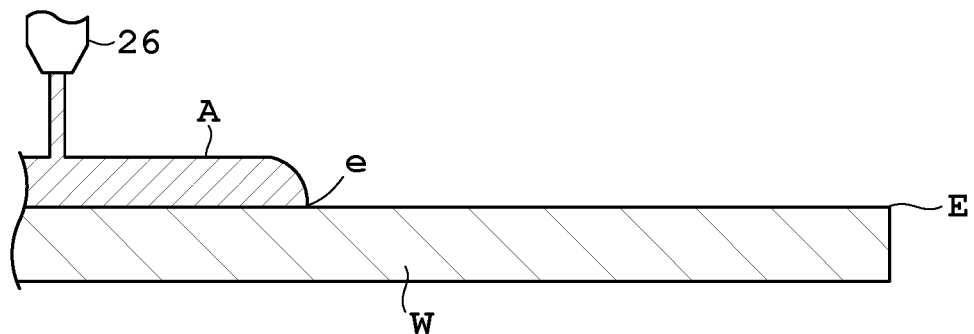
FIGS. 9A to 9D each schematically illustrate behavior of the solvent in the processing example 1.
Figure 9B:
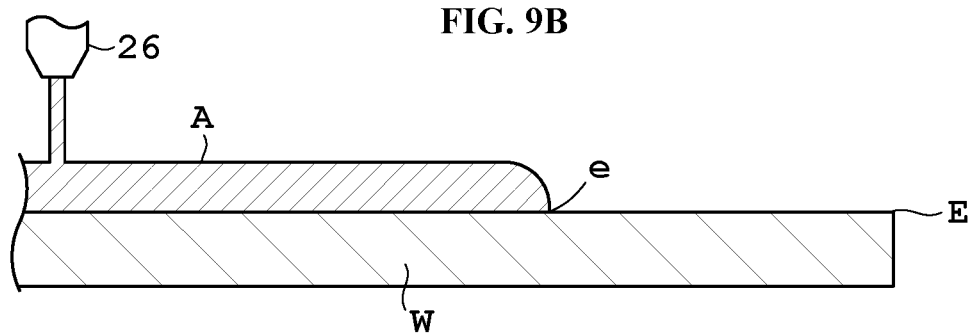
Figure 9C:
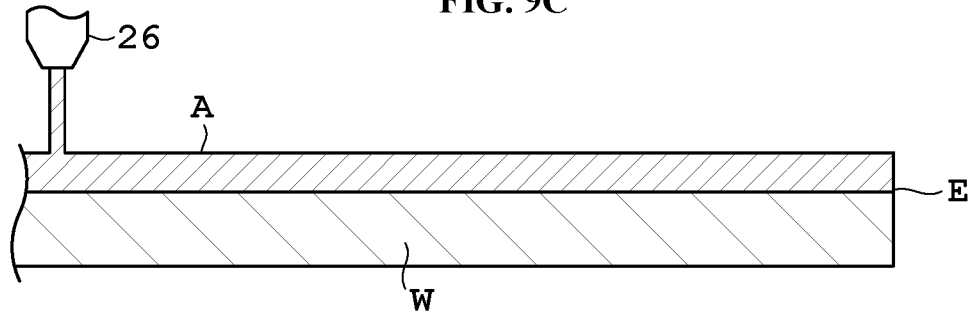
Figure 9D:
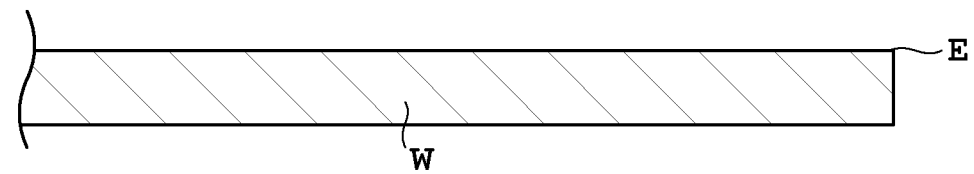

Firstly in the processing example 1, the core of the solvent A is formed on the substrate W (see FIG. 9A). Then, the rotation speed of the substrate W increases in a stepwise manner. The core of the solvent A expands. Such expansion of the core of the solvent A is performed smoothly. More specifically, the edge e of the core of the solvent A is unlikely to be irregular in shape (see FIG. 9B). In other words, the edge e is maintained in such a shape to contact the surface of the substrate W. Accordingly, the core of the solvent A expands without catching any air bubble. Therefore, almost no air bubble is on the substrate W even after the solvent A covers the surface of the substrate W (see FIG. 9C). Consequently, particles B resulting from the air bubbles are unlikely to be generated after the film of the solvent A is thinned or the solvent A is dried (see FIG. 9D).

In the present specification, the description "the core of the solvent A expands smoothly" is equivalent to a description that the edge e of the core of the solvent A extends over the substrate W while contacting the substrate W.

If at least one of the following three exemplified requirements is satisfied, the core of the solvent A expands smoothly. Since the processing example 1 satisfies all of the three requirements, the core of the solvent A expands extremely smoothly.

A first requirement is to supply the solvent A to the substrate W successively while the core of the solvent A expands. In the processing example 1, the solvent A is successively supplied to the substrate W from when the solvent starts to be supplied to the substrate W until when the solvent A reaches the periphery edge E of the substrate W. Accordingly, the edge e of the core of the solvent A extends smoothly over the surface of the substrate W while the core of the solvent A expands. In other words, the core of the solvent A expands smoothly.

A second requirement is to increase the rotation speed of the substrate W slowly while the core of the solvent A expands. In the processing example 1, the rotation speed of the substrate W increases from the first speed V1 to the second speed V2 and from the second speed V2 to the third speed V3 in a stepwise manner Since the rotation speed of the substrate W increases gradually, the centrifugal force increases slowly. As a result, the edge e of the core of the solvent A is unlikely to become irregular in shape by the centrifugal force.

A third requirement is that the rotation speed of the substrate W is relatively low while the core of the solvent A expands. In the processing example 1, the rotation speed of the substrate W is restricted to the third speed V3 (i.e., 100 rpm) or less from when the solvent A starts to be supplied to the substrate W until when the solvent A reaches the periphery edge E of the substrate W. Accordingly, this suitably suppresses irregularity in shape of the edge e of the core of the solvent A by the centrifugal force.

A certain correlation exists between the smooth expansion of the core of the solvent A and the uniform expansion of the core of the solvent A. In other words, a certain correlation relationship exists between a microscopic shape of the edge e of the core of the solvent A and a macroscopic shape of the core of the solvent A.

For instance, when the edge e of the core of the solvent A is not irregular in shape, it can be said that the core of the solvent A is kept circular in shape in plan view. For instance, when the core of the solvent A is kept circular in shape in plan view, it can be said that the edge e of the core of the solvent A is not irregular in shape. For instance, when the core of the solvent A has a part (also referred to as "beard" or "streak") that extends in an elongated manner toward a portion of the periphery edge E of the substrate W, it can be said that the edge e of the core of the solvent A is irregular in shape.

Consequently, maintaining the circular shape of the core of the solvent A in plane view is a goal or an index in the solvent supplying step.

Generation of the particles B is understood as above.

Effect of Processing Example 1

The processing example 1 produces the following effect.

In the solvent supplying step, the solvent A is supplied to the center part of the substrate W, whereby one core of the solvent A is temporarily formed on the center part of the substrate W. In the solvent supplying step, the rotation speed of the substrate W increases, whereby the core of the solvent A expands toward the periphery edge E of the substrate W. Moreover in the solvent supplying step, the solvent A is continuously supplied to the substrate W from the time t3 when the solvent A starts to be supplied to the substrate W until the time t8 when the solvent A reaches the periphery edge E of the substrate W. This achieves smooth expansion of the core of the solvent A until the time t8 when the solvent A reaches the periphery edge E of the substrate W. As a result, the solvent A is able to cover the entire surface of the substrate W while the particles B are effectively suppressed. In other words, this leads to improved processing quality of supplying the solvent A to the substrate W.

Since the solvent supplying step includes the first constant speed step, the core of the solvent A is able to be formed suitably on the substrate W.

In the first constant speed step, the first speed V1 is more than 0 rpm and less than 30 rpm, and thus is relatively low. This achieves more suitable generation of the core of the solvent A.

In the first constant speed step, the solvent A starts to be supplied to the center part of the substrate W. This allows suitable formation of the core of the solvent A at the center part of the substrate W.

The solvent supplying step includes the second and third constant speed steps in addition to the first constant speed step, and the rotation speed of the substrate W increases by three stages from the time t3 when the solvent A starts to be supplied to the substrate W until the time t8 when the solvent A reaches the periphery edge E of the substrate W. This achieves more smooth expansion of the core of the solvent A.

Since the solvent supplying step includes the first accelerating step, the centrifugal force F acting on the solvent A is able to increase positively before the time t8 when the solvent A reaches the periphery edge E of the substrate W. This achieves more smooth expansion of the core of the solvent A.

The solvent supplying step includes the second accelerating step in addition to the first accelerating step. Accordingly, the centrifugal force acting on the solvent A is able to increase positively before the time t8 when the solvent A reaches the periphery edge E of the substrate W at a plurality of (two) times. This achieves more smooth expansion of the core of the solvent A.

The rotation speed of the substrate W at the time t8 when the solvent A reaches the periphery edge E of the substrate W corresponds to the third speed V3. The third speed V3 is less than 1500 rpm, and thus is relatively low. Consequently, this achieves smooth expansion of the core of the solvent A.

In addition, the third speed V3 is less than 200 rpm, and thus is much lower. This achieves more smooth expansion of the core of the solvent A.

The rotation speed of the substrate W is restricted to the third speed V3 or less from the time t3 when the solvent A starts to be supplied to the substrate W until the time t8 when the solvent A reaches the periphery edge E of the substrate W. The third speed V3 is relatively low, achieving more smooth expansion of the core of the solvent A.

A difference in rotation speed of the substrate W between the two constant speed steps temporally preceding and following each other is 100 rpm or less. For instance, a difference between the first speed V1 and the second speed V2 is 20 rpm. For instance, a difference between the second speed V2 and the third speed V3 is 70 rpm. The rotation speed of the substrate W increases slowly in such a manner. This achieves more smooth expansion of the core of the solvent A.

The solvent A is constantly supplied to the center part of the surface of the substrate W from the time t3 when the solvent A starts to be supplied to the substrate W until the time t8 when the solvent A reaches the periphery edge E of the substrate W. This achieves more smooth expansion of the core of the solvent A.

Since the solvent supplying step includes the pre-accelerating step, the first constant speed step is able to be prepared suitably.

Since the substrate treating method includes the simple rotation step, the film of the solvent A formed on the substrate W is able to be thinned suitably.

Since the substrate treating method includes the chemical supplying step, improved processing quality of supplying the resist to the substrate W is suitably obtainable.

Processing Example 2

Figure 10:
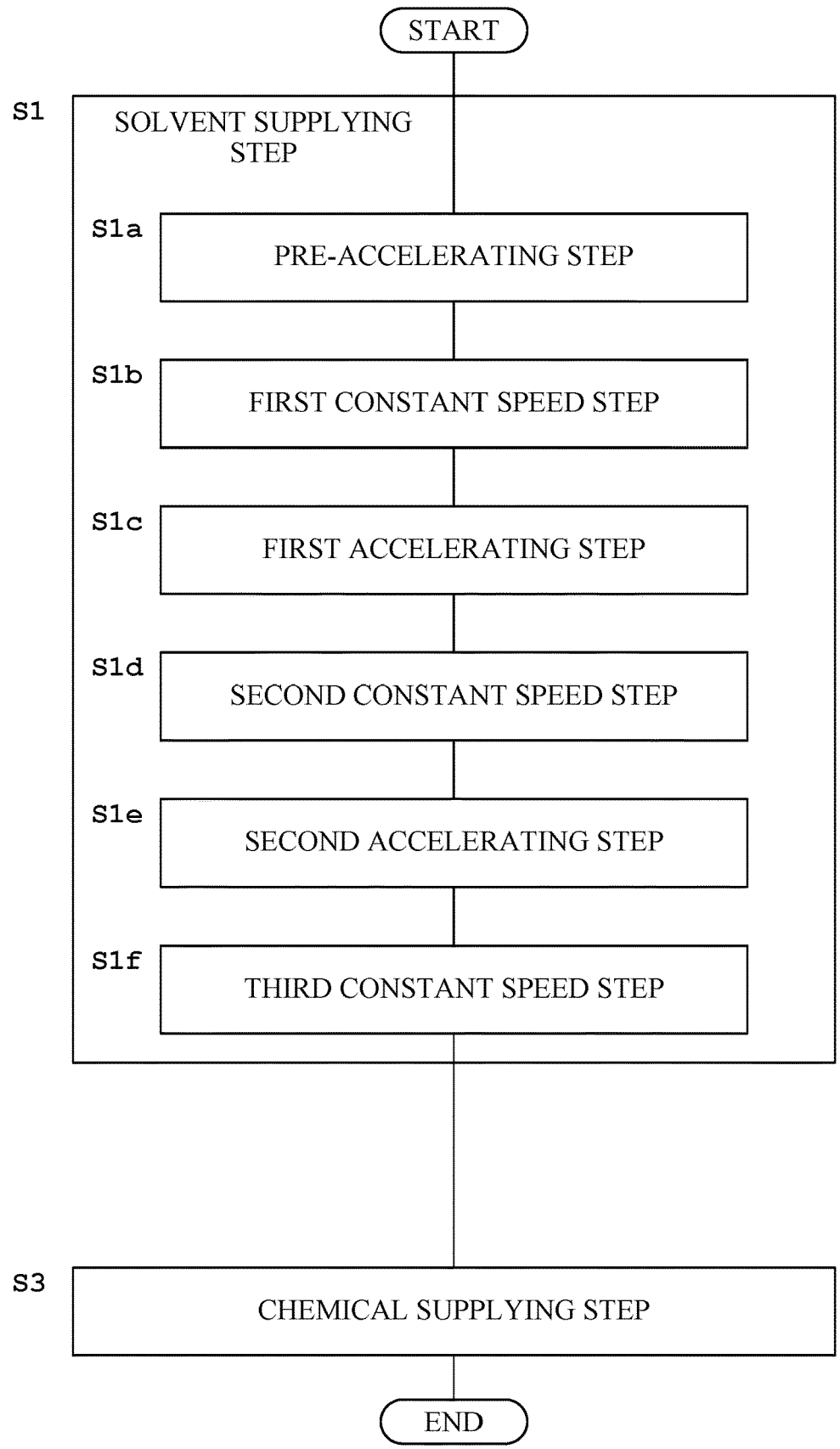
FIG. 10 is a flow chart of procedures in a processing example 2.

The following describes a processing example 2. FIG. 10 is a flow chart of procedures in the processing example 2. Like reference signs are used to identify like steps which are the same as in the processing example 1 and will be described only briefly.

The processing example 2 includes a solvent supplying step (Step S1) and a chemical supplying step (Step S3). The processing example 2 firstly performs the solvent supplying step. The processing example 2 performs the chemical supplying step after the solvent supplying step. The processing example 2 includes no simple rotation step. The solvent supplying step of the processing example 2 includes six processes (Steps S1a to S1f).

Figure 11:
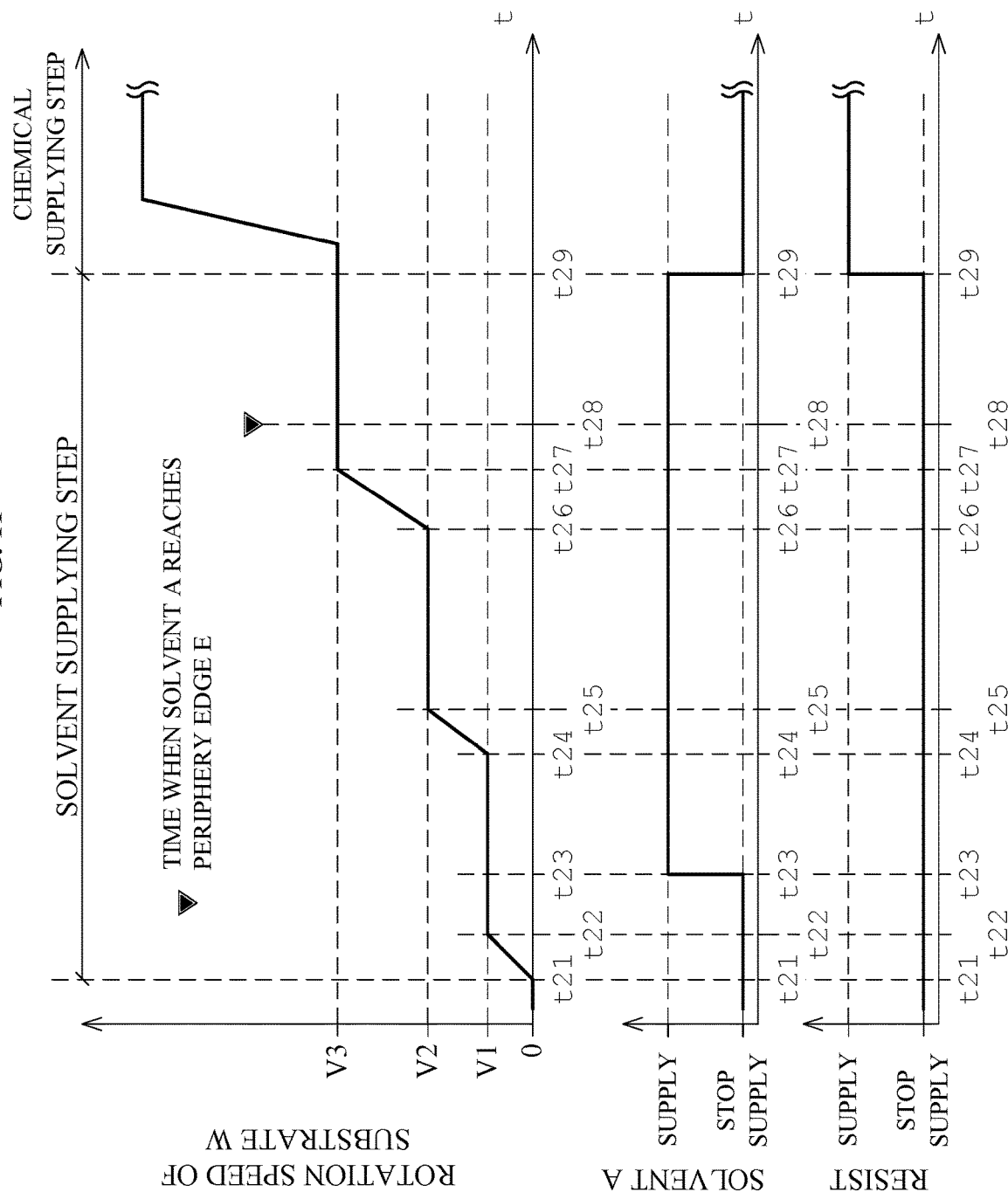
FIG. 11 is a timing chart of the procedures in the processing example 2.

FIG. 11 is a timing chart of procedures in the processing example 2. Each of the processes is to be described in detail with reference to FIG. 11.

<Step S1a> Pre-Accelerating Step (Time t21 to 22)

In a pre-accelerating step, the rotation speed of the substrate W increases from 0 rpm to the first speed V1 during a period of time t21 to t22.

The first speed V1 is, for example, 20 rpm. The period of time t21 to t22 is, for example, 0.1 seconds. Here, rotational acceleration of the substrate W during the period of time t21 to t22 is, for example, 200 rpm/s.

<Step S1b> First Constant Speed Step (Time t22 to t24)

In a first constant speed step, the rotation speed of the substrate W is maintained at the first speed V1 during a period of time t22 to time t24. In the first constant speed step, the solvent A starts to be supplied to the substrate W at time t23.

The period of time t22 to t24 is, for example, 3 seconds.

<Step S1c> First Accelerating Step (Time t24 to t25)

In a first accelerating step, the rotation speed of the substrate W increases from the first speed V1 to the second speed V2 during a period of time t24 to t25. In the first accelerating step, the solvent A is successively supplied to the substrate W.

The second speed V2 is, for example, 50 rpm. The period of time t24 to t25 is, for example, 0.5 seconds. Here, rotational acceleration of the substrate W during the period of time t24 to t25 is, for example, 60 rpm/s.

<Step S1d> Second Constant Speed Step (Time t25 to t26)

In a second constant speed step, the rotation speed of the substrate W is maintained at the second speed V2 during a period of time t25 to time t26. In the second constant speed step, the solvent A is successively supplied to the substrate W from the time t25 to the time t26.

The period of time t25 to t26 is, for example, 3 seconds.

<Step S1e> Second Accelerating Step (Time t26 to t27)

In a second accelerating step, the rotation speed of the substrate W increases from the second speed V2 to a third speed V3 during a period of time t26 to t27. In the second accelerating step, the solvent A is successively supplied to the substrate W.

The third speed V3 is, for example, 100 rpm. The period of time t26 to t27 is, for example, 1.0 second. Here, rotational acceleration of the substrate W during the period of time t26 to t27 is, for example, 50 rpm/s.

<Step S1f> Third Constant Speed Step (t27 to t29)

In the third constant speed step, the rotation speed of the substrate W is maintained at the third speed V3 during a period of time t27 to time t29. In the third constant speed step, the solvent A is successively supplied to the substrate W during the period of time t27 to time t29. The solvent A reaches the periphery edge E of the substrate W at time t28 in the third constant speed step.

The period of time t27 to time t29 is, for example, 3 seconds.

The supply of the solvent A to the substrate W stops at time t29. Accordingly, the third constant speed step is finished, and the solvent supplying step is completed.

<Step S3> Chemical Supplying Step (Subsequent to Time t29)

In the chemical supplying step, the resist starts to be supplied to the substrate W at time 29. That is, the supply of the resist to the substrate W starts when the supply of the solvent A to the substrate W stops. In the chemical supplying step, the resist is supplied to the substrate W subsequent to the time t29 while the rotation speed of the substrate W is changed.

Effect of Processing Example 2

The processing example 2 produces the effect similar to that by the processing example 1. For instance, the processing example 2 also effectively improves processing quality of supplying the solvent A to the substrate W.

Moreover, in the processing example 2, the chemical supplying step starts at a time when the solvent supplying step is completed. In other words, in the processing example 2, the resist starts to be supplied to the substrate W at the time t29 when the supply of the solvent A to the substrate W is completed. Since the resist is supplied on the solvent A before the solvent A is dried, the resist spreads over the substrate W more smoothly. This achieves effectively improved quality of supplying the resist to the substrate W (i.e., forming the resist film on the substrate W).

Processing Example 3

Figure 12:
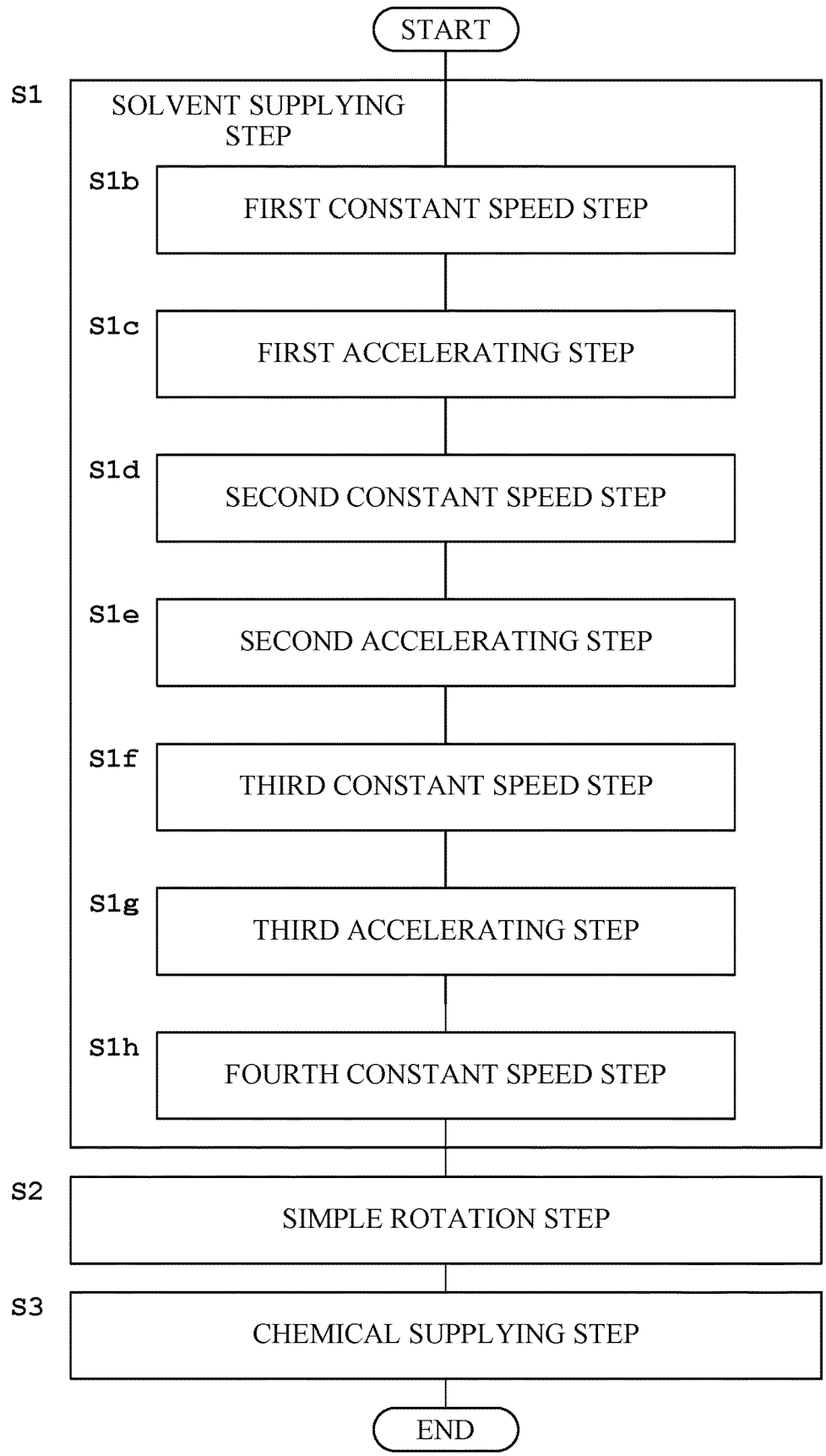
FIG. 12 is a flow chart of procedures in a processing example 3.

The following describes a processing example 3. FIG. 12 is a flow chart of procedures in the processing example 3. Like reference signs are used to identify like steps which are the same as in the processing example 1 and will be described only briefly.

The processing example 3 includes a solvent supplying step (Step S1), a simple rotation step (Step S2), and a chemical supplying step (Step S3). The solvent supplying step (Step S1) of the processing example 3 differs from the solvent supplying step of the processing example 1. The solvent supplying step of the processing example 3 includes seven processes (Steps S1b to S1h).

Figure 13:
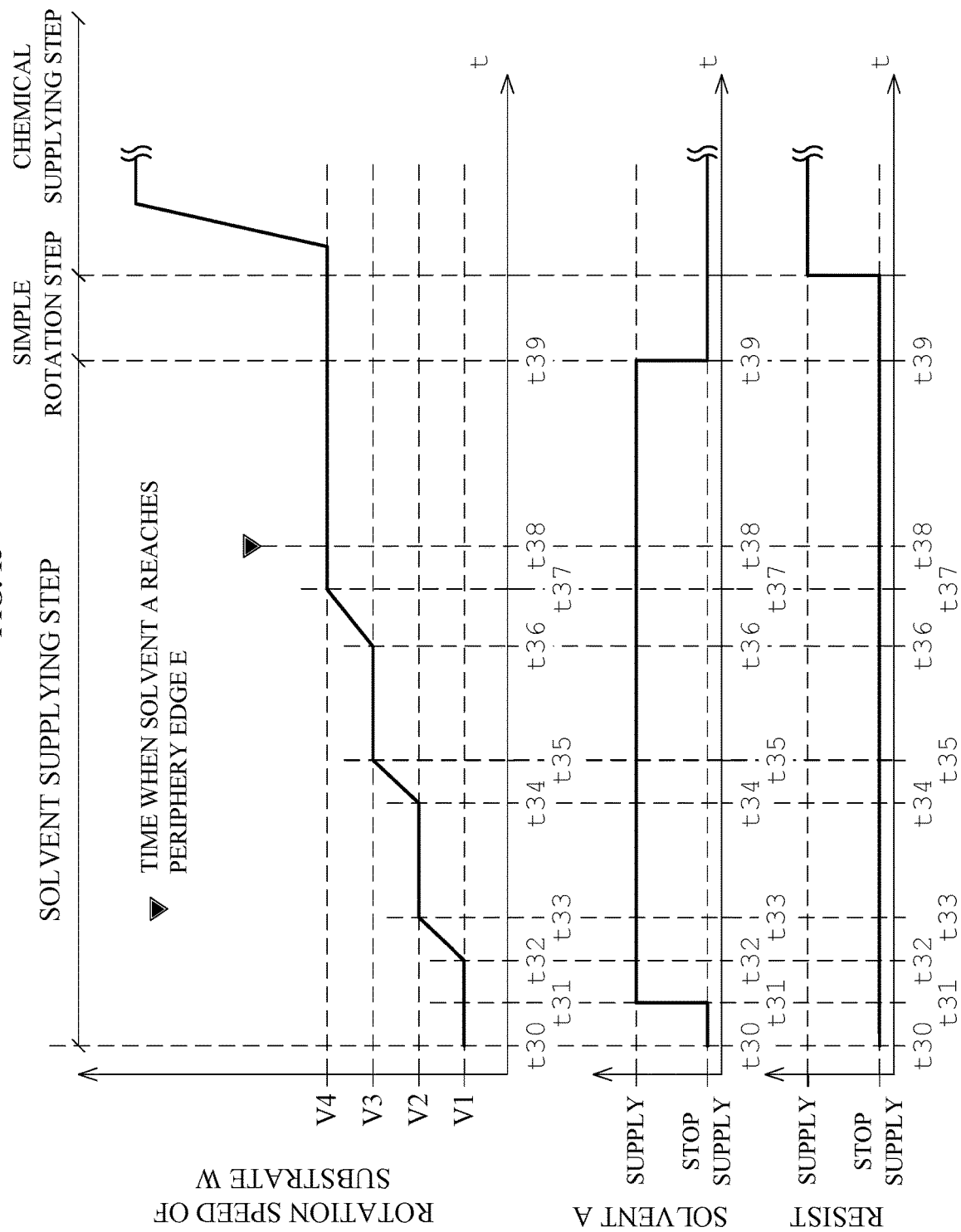
FIG. 13 is a timing chart of the procedures in the processing example 3.

FIG. 13 is a timing chart of the procedures in the processing example 3. The following describes in detail the solvent supplying step with reference to FIG. 13. The simple rotation step and the chemical supplying step of the processing example 3 are each substantially equal to that of the processing example 1, and thus the description thereof is to be omitted.

<Step S1b> First Constant Speed Step (Time t30 to t32)

In a first constant speed step, the rotation speed of the substrate W is maintained at the first speed V1 during a period of time t30 to time t32. In the first constant speed step, the solvent A starts to be supplied to the substrate W from time t31.

The first speed V1 is, for example, zero. The period of time t30 to t32 is, for example, 2 seconds.

<Step S1c> First Accelerating Step (Time t32 to t33)

In a first accelerating step, the rotation speed of the substrate W increases from the first speed V1 to a second speed V2 during a period of time t32 to t33. In the first accelerating step, the solvent A is successively supplied to the substrate W.

The second speed V2 is, for example, 10 rpm. The period of time t32 to t33 is, for example, 0.1 seconds. Here, rotational acceleration of the substrate W for the period of time t32 to t33 is, for example, 100 rpm/s.

<Step S1d> Second Constant Speed Step (Time t33 to t34)

In a second constant speed step, the rotation speed of the substrate W is maintained at a second speed V2 during a period of time t33 to time t34. In the second constant speed step, the solvent A is successively supplied to the substrate W during the period of time t33 to time t34.

The period of time t33 to t34 is, for example 2 seconds.

<Step S1e> Second Accelerating Step (time t34 to t35)

In a second accelerating step, the rotation speed of the substrate W increases from the second speed V2 to a third speed V3 for a period of time t34 to t35. In the second accelerating step, the solvent A is successively supplied to the substrate W.

The third speed V3 is, for example, 30 rpm. The period of time t35 to t36 is, for example, 0.5 seconds. Here, rotational acceleration of the substrate W for the period of time t34 to t35 is, for example, 40 rpm/s.

<Step S1f> Third Constant Speed Step (Time t35 to t36)

In a third constant speed step, the rotation speed of the substrate W is maintained at the third speed V3 during a period of time t35 to t36. In the third constant speed step, the solvent A is successively supplied to the substrate W during the period of time t35 to t36.

The period of time t35 to t36 is, for example, 2 seconds.

<Step S1g> Third Accelerating Step (Time t36 to t37)

In a third accelerating step, the rotation speed of the substrate W increases from the third speed V3 to a fourth speed V4 during a period of time t36 to t37. In the third accelerating step, the solvent A is successively supplied to the substrate W.

The fourth speed V4 is, for example, 100 rpm. The period of time t36 to t37 is, for example, 1.0 second. Here, rotational acceleration of the substrate W for the period of time t36 to t37 is, for example, 70 rpm/s.

<Step S1h> Fourth Constant Speed Step (Time t37 to t39)

In a fourth constant speed step, the rotation speed of the substrate W is maintained at the fourth speed V4 during a period of time t37 to time t39, and the solvent A is successively supplied to the substrate W. In the fourth constant speed step, the solvent A reaches the periphery edge E of the substrate W at time t38.

The period of time t37 to t39 is, for example, 4 seconds.

The supply of the solvent A to the substrate W stops at time t39 when the fourth constant speed step is finished. Accordingly, the fourth constant speed step is finished and the solvent supplying step is completed.

Effect of Processing Example 3

The processing example 3 produces the effect similar to that by the processing example 1. For instance, the processing example 3 also effectively improves processing quality of supplying the solvent A to the substrate W.

Moreover, since the first speed V1 in the first constant speed step of the processing example 3 is zero, the solvent A starts to be supplied to the substrate W at rest in the first constant speed step. This allows suitable generation of the core of the solvent A on the substrate W.

In the solvent supplying step, the four constant speed steps (i.e., the first to fourth constant speed steps) are performed from the time t31 when the solvent A starts to be supplied to the substrate W until the time t38 when the solvent A reaches the periphery edge E of the substrate W. That is, in the solvent supplying step, the rotation speed of the substrate W increases by four stages. Accordingly, the core of the solvent A is expandable more smoothly.

Processing Example 4

Figure 14:
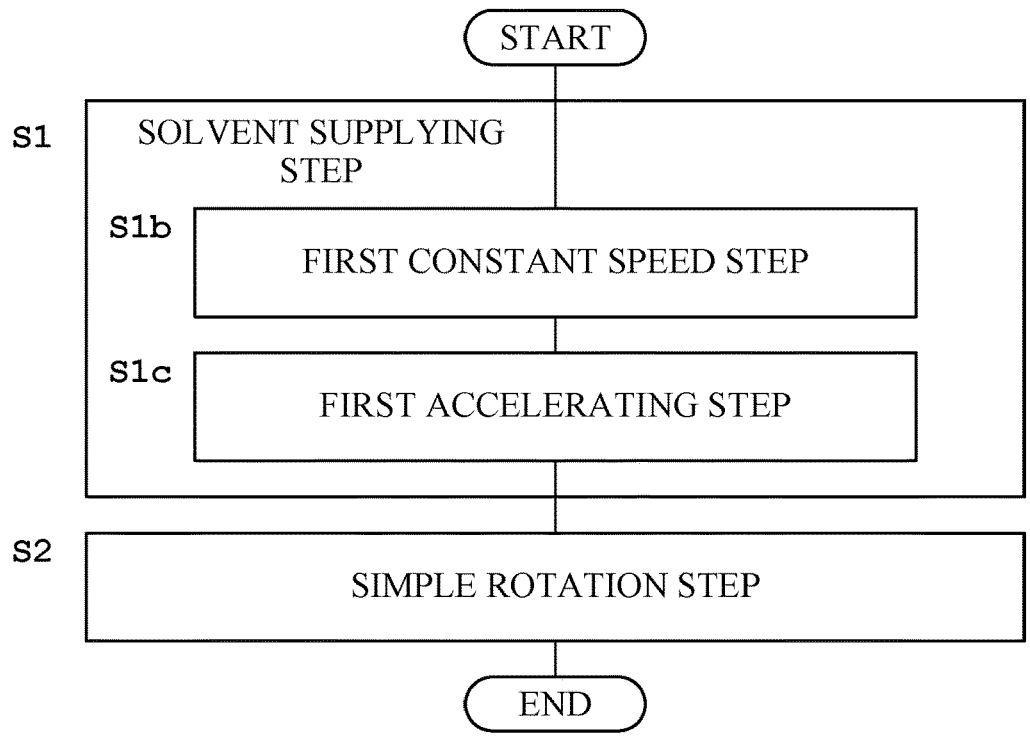
FIG. 14 is a flow chart of procedures in a processing example 4.

The following describes a processing example 4. FIG. 14 is a flow chart of procedures in the processing example 4. Like reference signs are used to identify like steps which are the same as in the processing example 1 and will be described only briefly.

As illustrated, the processing example 4 includes a solvent supplying step (Step S1) and a simple rotation step (Step S2). The processing example 4 includes no chemical supplying step. The solvent supplying step of the processing example 4 differs from the solvent supplying step of the processing example 1. Specifically, the solvent supplying step of the processing example 4 includes two processes (Steps S1b and S1c).

Figure 15:
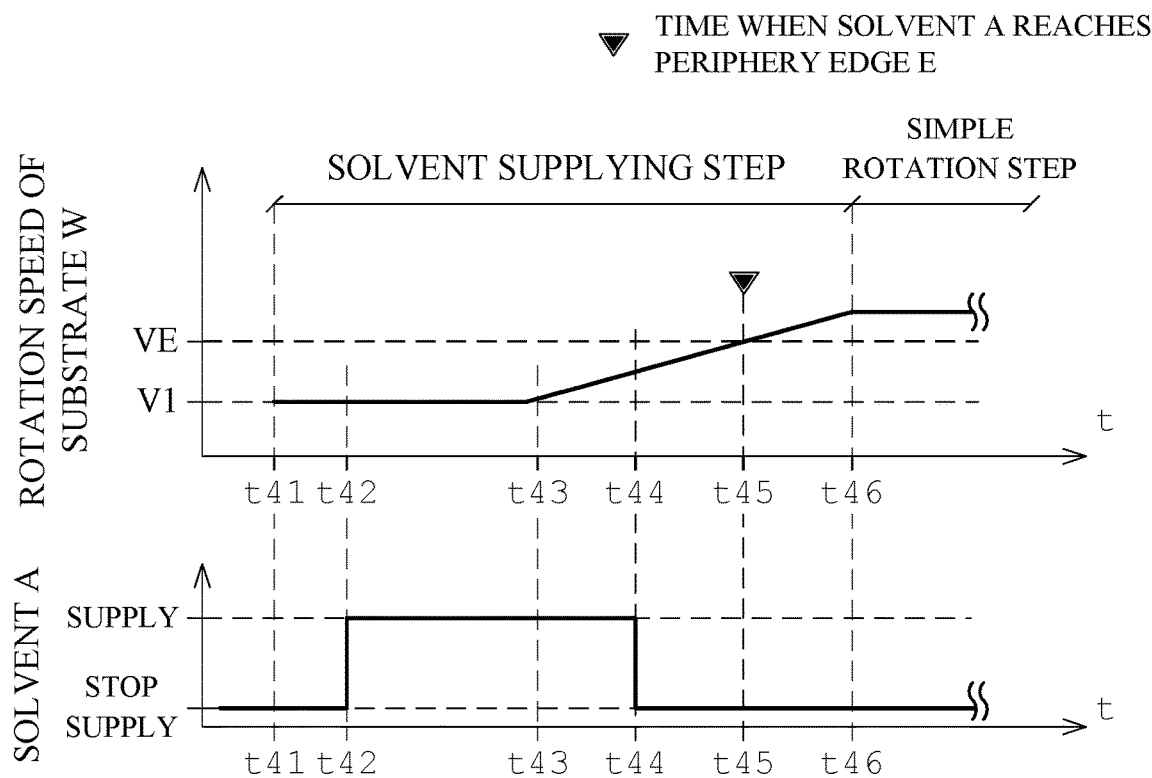
FIG. 15 is a timing chart of the procedures in the processing example 4.

FIG. 15 is a timing chart of procedures in the processing example 4. The following describes in detail the solvent supplying step with reference to FIG. 15. The simple rotation step of the processing example 4 is substantially equal to that of processing example 1, and thus the description thereof is to be omitted.

<Step S1b> First Constant Speed Step (Time t41 to t43)

In a first constant speed step, the rotation speed of the substrate W is maintained at the first speed V1 during a period of time t41 to t43. In the first constant speed step, the solvent A starts to be supplied to the substrate W at time t42.

It is preferred that the first speed V1 is 0 rpm or more and less than 30 rpm.

<Step S1c> First Accelerating Step (Time t43 to t46)

In the first accelerating step, the rotation speed of the substrate W increases from the first speed V1 during a period of time t43 to t46. Here, rotational acceleration of the substrate W during the period of time t43 to t46 is constant. In the first accelerating step, the solvent A is successively supplied to the substrate W until the time t44. In the first accelerating step, the supply of the solvent A is finished at time t44. The solvent A reaches the periphery edge E of the substrate W at time t45. That is, the solvent A reaches the periphery edge E of the substrate W after the supply of the solvent A is finished.

It is preferred that the rotation speed VE of the substrate W at the time t45 when the solvent A reaches the periphery edge E of the substrate W is less than 1500 rpm. It is more preferred that the rotation speed VE is less than 200 rpm.

Effect of Processing Example 4

The processing example 4 produces the following effect. That is, the rotation speed of the substrate W slowly increases from the time t42 when the solvent A starts to be supplied to the substrate W until the time t45 when the solvent A reaches the periphery edge E of the substrate W. Accordingly, the core of the solvent A is expandable smoothly. This leads to effectively improved processing quality of supplying the solvent A to the substrate W.

The rotation speed VE of the substrate W when the solvent A reaches the periphery edge E of the substrate W is relatively low. In other words, the rotation speed of the substrate W is restricted to a relatively low extent from the time t42 when the solvent A starts to be supplied to the substrate W to the time t45 when the solvent A reaches the periphery edge E of the substrate W. This achieves more smooth expansion of the core of the solvent A.

The first accelerating step corresponds to an accelerating step firstly performed after the solvent A starts to be supplied to the substrate W. The solvent A is successively supplied until this first accelerating step starts (more specifically, until the rotation speed of the substrate W starts to increase in the first accelerating step). Consequently, the core of the solvent A is expandable smoothly at least at the beginning when the core of the solvent A starts to expand.

Processing Example 5

Figure 16:
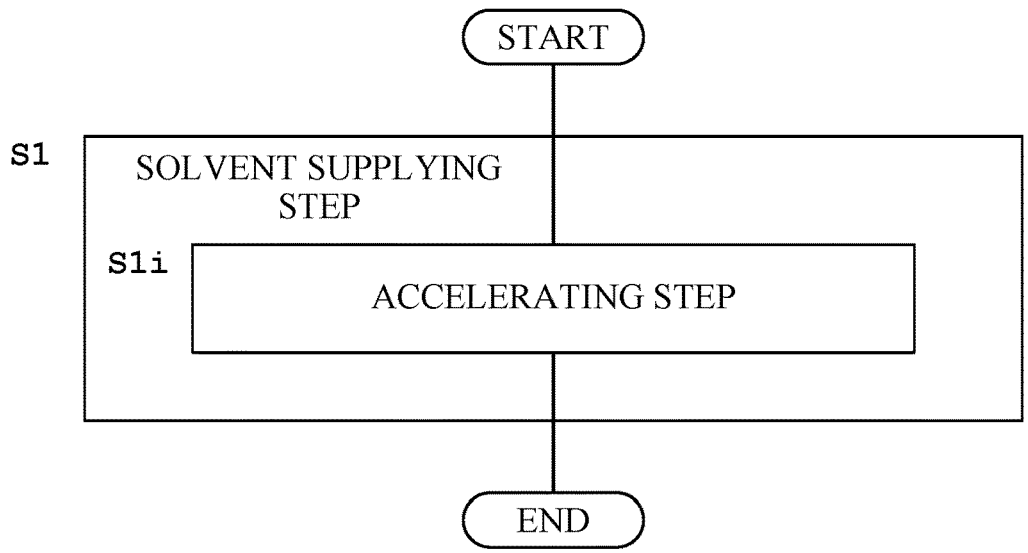
FIG. 16 is a flow chart of procedures in a processing example 5.

The following describes a processing example 5. FIG. 16 is a flow chart of procedures in the processing example 5. Like reference signs are used to identify like steps which are the same as in the processing example 1 and will be described only briefly.

As illustrated, the processing example 5 includes a solvent supplying step (Step S1). The processing example 5 includes neither a simple rotation step nor a chemical supplying step. The solvent supplying step of the processing example 5 differs from the solvent supplying step of the processing example 1. That is, the solvent supplying step of the processing example 5 includes one process (Step S1i).

Figure 17:
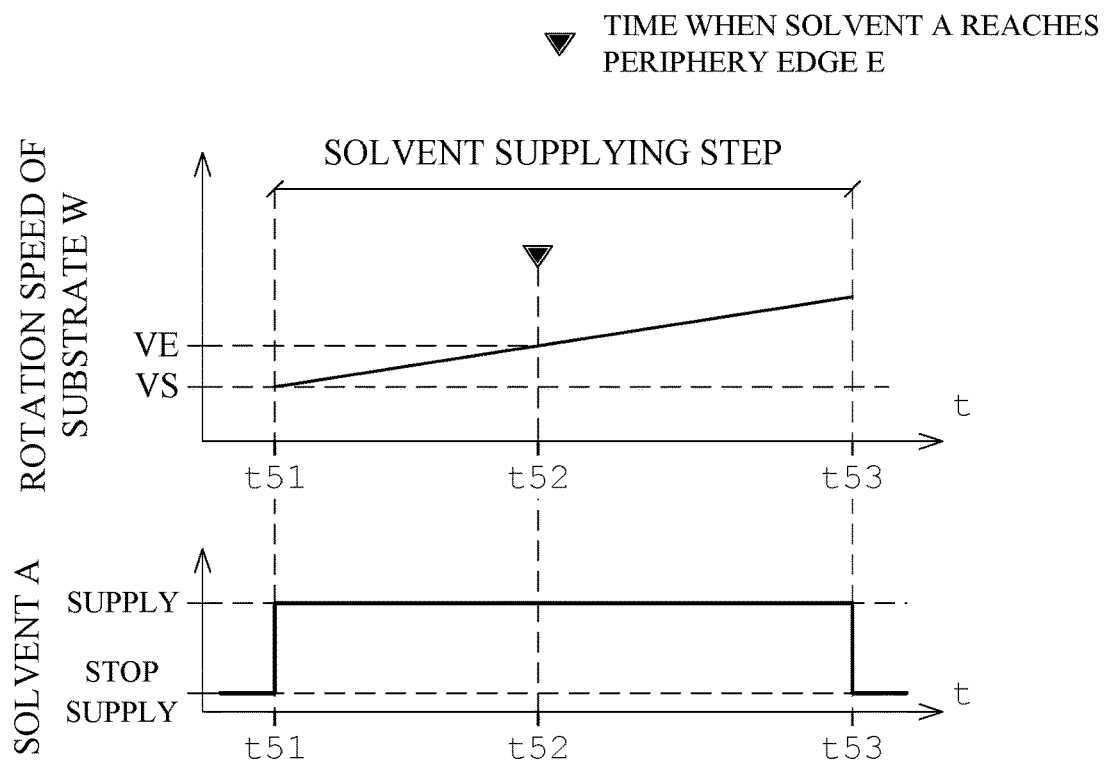
FIG. 17 is a timing chart of the procedures in the processing example 5.

FIG. 17 is a timing chart of procedures in the processing example 5. The following describes in more detail the solvent supplying step with reference to FIG. 17.

\<Step S1i\> Accelerating Step (Time t51 to t53)

In an accelerating step, the rotation speed of the substrate W increases during a period of time t51 to t53. In the accelerating step, the solvent A starts to be supplied to the substrate W at the time t51. In the accelerating step, the solvent A is successively supplied to the substrate W until the time t53. In the accelerating step, the supply of the solvent A to the substrate W is finished at time t53. The solvent A reaches the periphery edge E of the substrate W at time t52 in the accelerating step.

It is preferred that a rotation speed VS of the substrate W at the time t51 when the solvent A starts to be supplied to the substrate W is 0 rpm or more and less than 30 rpm. It is preferred that a rotation speed VE of the substrate W at the time t52 when the solvent A reaches the periphery edge E of the substrate W is less than 1500 rpm. It is more preferred that the rotation speed VE is less than 200 rpm. It is also preferred that the rotational acceleration of the substrate W is constant during the period of time t51 to t53.

Effect of Processing Example 5

The processing example 5 produces the following effect.

That is, the rotation speed of the substrate W increases slowly when the core of the solvent A expands in the solvent supplying step. Specifically, the rotation speed of the substrate W successively increases from the time t51 when the solvent A starts to be supplied to the substrate W until the time t52 when the solvent A reaches the periphery edge E of the substrate W. Accordingly, the core of the solvent A is expandable smoothly. This achieves effectively improved processing quality of supplying the solvent A to the substrate W.

In the solvent supplying step, the solvent A is successively supplied to the substrate W when the core of the solvent A expands. Specifically, the solvent A is successively supplied to the substrate W from the time t51 when the solvent A is supplied to the substrate W to the time t52 when the solvent A reaches the periphery edge E of the substrate W. This achieves smooth expansion of the core of the solvent A.

Here, the rotation speed VE of the substrate W is relatively low when the solvent A reaches the periphery edge E of the substrate W. That is, the rotation speed of the substrate W is restricted to a relatively low extent from the time t51 when the solvent A starts to be supplied to the substrate W until the time t52 when the solvent A reaches the periphery edge E of the substrate W. Accordingly, the core of the solvent A is expandable more smoothly.

The rotational acceleration of the substrate W is constant from the time t51 when the solvent A starts to be supplied to the substrate W to the time t52 when the solvent A reaches the periphery edge E of the substrate W. Accordingly, the rotation speed of the substrate W increases continuously at a given rate. This achieves more smooth expansion of the core of the solvent A.

Processing Example 6

Figure 18:
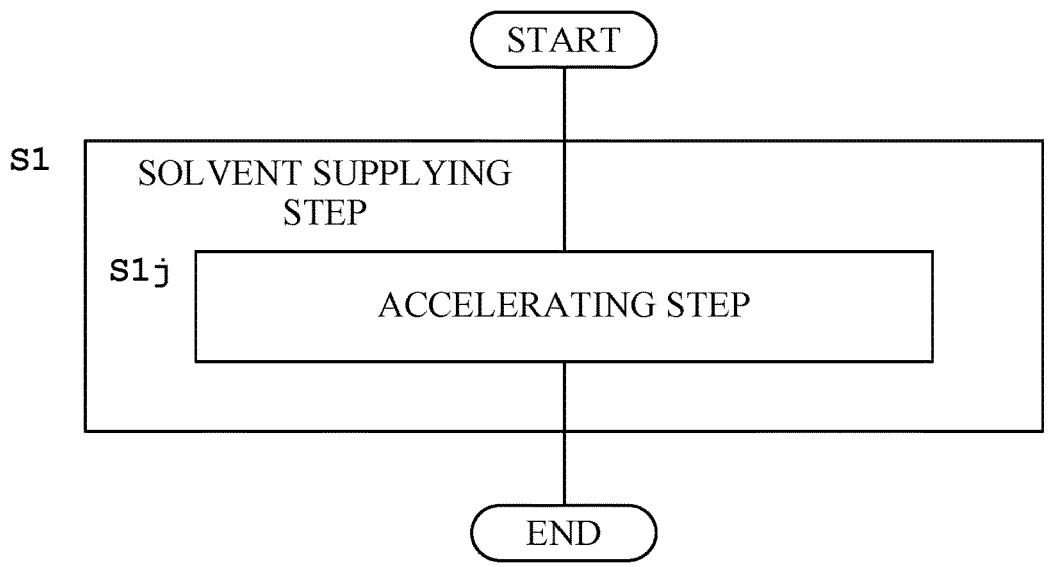
FIG. 18 is a flow chart of procedures in a processing example 6.

The following describes a processing example 6. FIG. 18 is a flow chart of procedures in the processing example 6. Like reference signs are used to identify like steps which are the same as in the processing example 1 and will be described only briefly.

As illustrated, the processing example 6 includes a solvent supplying step (Step S1). The processing example 6 includes neither a simple rotation step nor a chemical supplying step. The solvent supplying step of the processing example 6 differs from the solvent supplying step of the processing example 1. The solvent supplying step of the processing example 6 includes one process (Step S1j).

Figure 19:
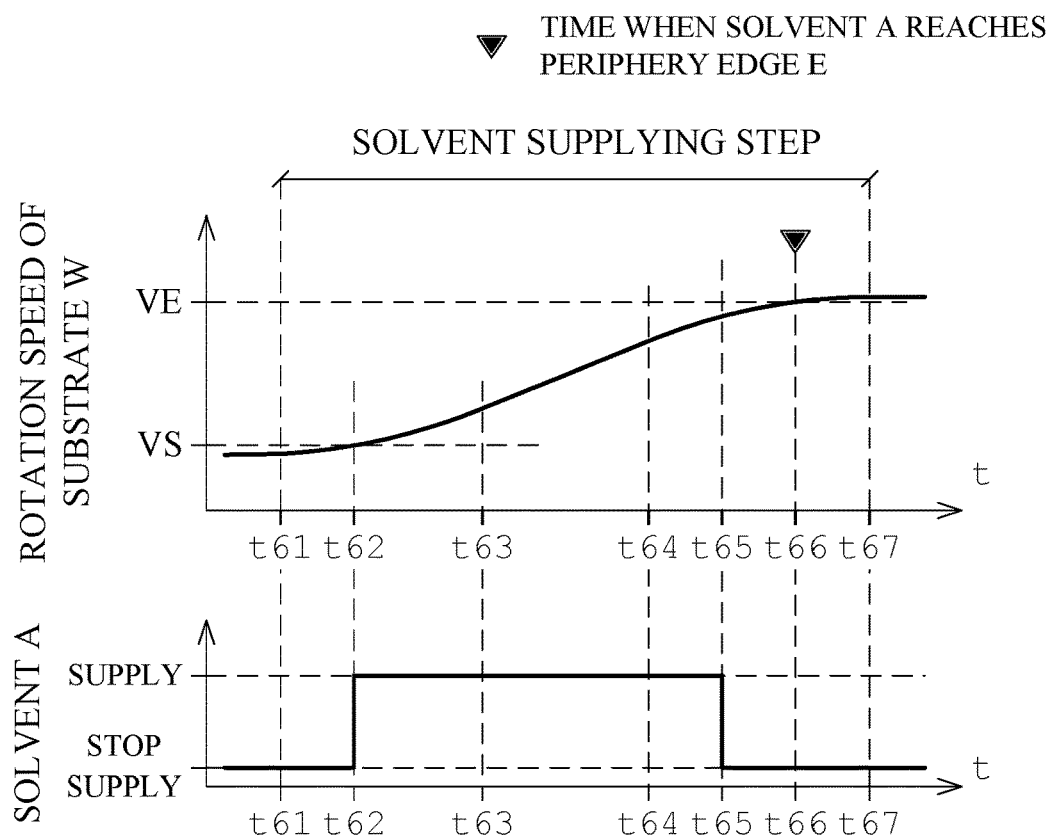
FIG. 19 is a timing chart of the procedures in the processing example 6.

FIG. 19 is a timing chart of procedures in the processing example 6. The following describes in detail of the solvent supplying step with reference to FIG. 19.

\<Step S1j\> Accelerating Step (Time t61 to t67)

In an accelerating step, the rotation speed of the substrate W starts to increase at time t61. In the accelerating step, increase in rotation speed of the substrate W is finished at time t67.

In the accelerating step, the rotation speed of the substrate W increases in an S-shaped manner at the beginning of the increase in rotation speed of the substrate W. More specifically, rotational acceleration of the substrate W per unit time increases with the lapse of time during a period of time t61 to time t63 in the accelerating step. Accordingly, the rotational acceleration of the substrate W increases slowly at the beginning of the increase in rotation speed of the substrate W. Hereinafter, the increase in rotational acceleration of the substrate W per unit time with the lapse of time is referred to as a "first S-shaped acceleration drive".

Moreover, the rotation speed of the substrate W increases in an S-shaped manner upon the increase in rotation speed of the substrate W is finished in the accelerating step. More specifically, the rotational acceleration of the substrate W per unit time decreases to zero with the lapse of time during a period of time t64 to time t67 in the accelerating step. Accordingly, the rotational acceleration of the substrate W decreases slowly when the increase in rotation speed of the substrate W is finished. Hereinafter, the decrease in rotational acceleration of the substrate W per unit time with the lapse of time is referred to as a "second S-shaped acceleration drive".

The rotational acceleration of the substrate W is maintained constant from when the first S-shaped acceleration drive is finished until when the second S-shaped acceleration drive is started in the accelerating step. More specifically, the rotation speed of the substrate W increases with constant acceleration during a period of time t63 to time t64 in the accelerating step. Hereinafter, increase in rotation speed of the substrate W with constant acceleration is referred to as "constant acceleration drive".

It is preferred that the rotational acceleration of the substrate W in the constant acceleration drive is equal to the rotational acceleration of the substrate W upon finish of the first S-shaped acceleration drive. It is also preferred that the rotational acceleration of the substrate W in the constant acceleration drive is equal to the rotational acceleration of the substrate W upon start of the second S-shaped acceleration drive.

In the accelerating step, the solvent A is supplied to the substrate W during the period of time t62 to time t65.

In the accelerating step, the solvent A starts to be supplied to the substrate W at the time t62. In other words, the solvent A starts to be supplied to the substrate W while the first S-shaped acceleration drive is performed.

In the accelerating step, the supply of the solvent A to the substrate W stops at time t65. That is, the supply of the solvent A to the substrate W stops while the second S-shaped acceleration drive is performed in the accelerating step.

The solvent A reaches the periphery edge E of the substrate W at time t66 when the second S-shaped acceleration drive is performed. As noted above, the rotation speed of the substrate W successively increases in the accelerating step until the time t66 when the solvent A reaches the periphery edge E of the substrate W. Here, the time t66 when the solvent A reaches the periphery edge E of the substrate W comes after the time t65 when the supply of the solvent A to the substrate W is finished.

The accelerating step is finished and the solvent supplying step is completed at the time t67.

Effect of Processing Example 6

The processing example 6 produces the following effect.

In the solvent supplying step, the rotation speed of the substrate W increases in the S-shaped manner during at least a part of the period of time t62 when the solvent A starts to be supplied to the substrate W to the time t66 when the solvent A reaches the periphery edge E of the substrate W. Accordingly, the rotation speed of the substrate W increases extremely slowly when the core of the solvent A expands. This allows much smooth expansion of the core of the solvent A.

In the solvent supplying step, the first S-shaped acceleration drive is performed during the period of time t61 to time t63. This achieves smooth increase in rotation speed of the substrate W with the lapse of time. In addition, the solvent A starts to be supplied to the substrate W while the first S-shaped acceleration drive is performed. This allows more suitable generation of the core of the solvent A on the substrate W.

In the solvent supplying step, the second S-shaped acceleration drive is performed during the period of time t64 to time t66. This allows slow convergence of the rotation speed of the substrate W with the lapse of time.

The rotational acceleration of the substrate W upon the finish of the first S-shaped acceleration drive is equal to the rotational acceleration of the substrate W in the constant acceleration drive. Accordingly, the rotational acceleration of the substrate W does not change sharply at time t63 when the first S-shaped acceleration drive is shifted to the constant acceleration drive. This allows more smooth expansion of the core of the solvent A.

Likewise, the rotational acceleration of the substrate W in the constant acceleration drive is equal to the rotational acceleration of the substrate W upon start of the second S-shaped acceleration drive. Accordingly, the rotational acceleration of the substrate W does not change sharply at the time t64 when the constant acceleration drive is shifted to the second S-shaped acceleration drive. This allows more smooth expansion of the core of the solvent A toward the periphery edge E of the substrate W.

The present invention is not limited to the foregoing examples, but may be modified as follows.

(1) In each of the processing examples 1 to 6 mentioned above, the solvent A is constantly supplied to the center part of the surface of the substrate W. However, this is not limitative. That is, the solvent A is not necessarily supplied to the center part of the surface of the substrate W constantly. For instance, a position where the solvent A is supplied is variable appropriately. For instance, the following is applicable. That is, the solvent A is supplied to the center part of the substrate W when the solvent A starts to be supplied to the substrate W, and then, the position where the solvent A is supplied is shifted toward the periphery edge E of the substrate W.

(2) In each of the embodiments mentioned above, the solvent A enhances wettability of the resist. However, this is not limitative. The solvent A may enhance wettability of a coating liquid other than the resist. Here, examples of the coating liquid other than the resist include an antireflection film material, a protective film material, a Spin On Glass (SOG) film material, and a Spin on Dielectric (SOD) film material. Alternatively, the solvent A may enhance wettability of chemical other than the coating liquid. Examples of the chemical other than the coating liquid include a developing liquid.

The solvent A may cause the surface of the substrate W to be wettable with the chemical. For instance, the solvent A may cause the surface of the substrate W to be wettable with the developing liquid.

The solvent A may dilute the chemical.

Alternatively, the solvent A may be used for purposes independent of the chemical. For instance, the solvent A may be used for reforming the surface of the substrate W. For instance, the solvent A may be used for enhancing wettability of the surface of the substrate W.

(2) In each of the embodiments mentioned above, the chemical is the resist. However, this is not limitative. As mentioned above, the chemical may be the coating liquid other than the resist (e.g., an antireflection film material, a protective film material, an SOG film material, and an SOD film material). Alternatively, the chemical may be a developing liquid.

(3) In the simple rotation step of each of the processing examples 1, 3, and 4 mentioned above, the solvent A may be or may not be dried.

(4) In the first constant speed step of each of the processing examples 1 and 2 mentioned above, the solvent A starts to be supplied to the substrate W. However, this is not limitative. For instance, the solvent A may start to be supplied to the substrate W in the pre-accelerating step.

(5) In the third constant speed step of each of the processing examples 1 and 2 mentioned above, the solvent A reaches the periphery edge E of the substrate W. However, this is not limitative. For instance, the solvent A may reach the periphery edge E of the substrate W in the second constant speed step. In such a modification, at least either the second accelerating step or the third constant speed step may be omitted.

Alternatively, the solvent A may reach the periphery edge E of the substrate W in any of the first and the second accelerating steps. In such a modification, at least the constant speed step or the accelerating step after the solvent A reaches the periphery edge E of the substrate W may be omitted.

(6) In each of the processing examples mentioned above, the number of the constant speed step in the solvent supplying step is variable appropriately. For instance, the number of the constant speed step in the solvent supplying step may be one. For instance, the number of the constant speed step in the solvent supplying step may be two. For instance, the number of the constant speed step in the solvent supplying step may be three or more. For instance, the solvent supplying step may include no constant speed step.

(7) In the accelerating step of each of the processing examples 1 to 5 mentioned above, the rotation speed of the substrate W increases with constant rotational acceleration. However, this is not limitative. That is, the rotation speed of the substrate W may increase while the rotational acceleration of the substrate W is varied in at least any of the accelerating steps. Alternatively, as illustrated in the processing example 6, the rotation speed of the substrate W may increase in the S-shaped manner in at least any of the accelerating steps.

(8) In each of the embodiments mentioned above, the spin holder 11 includes the spin chuck 13. However, this is not limitative. For instance, the spin holder 11 may include, instead of the spin chuck 13, a rotary table with a plurality of pins that hold the periphery edge E of the substrate W.

(9) In each of the processing examples mentioned above, a timing of moving the nozzles 26 and 36 is variable appropriately. In the processing example 1, the nozzle 26 is moved from the retracted position to the treatment position in the first constant speed step. However, this is not limitative. For instance, the nozzle 26 may be moved to the treatment position prior to the first constant speed step.

(10) Each of the embodiments mentioned above and the modifications (1) to (9) may be varied appropriately by additional replacement or combination of the elements therein with elements in other modifications.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method for treating a substrate, the substrate treating method comprising:
    a solvent supplying step of supplying a solvent at a center part of the substrate while increasing a rotation speed of the substrate, wherein
    in the solvent supplying step, the solvent is continuously supplied to the substrate until the solvent reaches a periphery edge of the substrate,
    the solvent supplying step further comprises:
    a first constant speed step of maintaining the rotation speed of the substrate at a first speed while the solvent is supplied to the substrate; and
    a first accelerating step of increasing the rotation speed of the substrate from the first speed to a second speed, higher than the first speed, subsequent to the first constant speed step while the solvent is continuously supplied to the substrate, and
    the first accelerating step starts before the solvent reaches the periphery edge of the substrate.

2. The substrate treating method according to claim 1, wherein
    the solvent supplying step further comprises a second constant speed step of maintaining the rotation speed of the substrate at the second speed subsequent to the first accelerating step while the solvent is continuously supplied to the substrate, and
    the second constant speed step starts before the solvent reaches the periphery edge of the substrate.

3. The substrate treating method according to claim 2, wherein
    the solvent supplying step further comprises a second accelerating step of increasing the rotation speed of the substrate from the second speed to a third speed, higher than the second speed, subsequent to the second constant speed step while the solvent is continuously supplied to the substrate, and
    the second accelerating step starts before the solvent reaches the periphery edge of the substrate.

4. The substrate treating method according to claim 3, wherein
    the solvent supplying step further comprises a third constant speed step of maintaining the rotation speed of the substrate at the third speed subsequent to the second accelerating step while the solvent is continuously supplied to the substrate, and
    the third constant speed step starts before the solvent reaches the periphery edge of the substrate.

5. The substrate treating method according to claim 1, wherein
    the first speed is 0 rpm or more and less than 30 rpm.

6. The substrate treating method according to claim 1, wherein
    the rotation speed of the substrate when the solvent reaches the periphery edge of the substrate is less than 1500 rpm.

7. The substrate treating method according to claim 1, wherein
    the rotation speed of the substrate when the solvent reaches the periphery edge of the substrate is less than 200 rpm.

8. The substrate treating method according to claim 1, wherein
    in the solvent supplying step, the rotation speed of the substrate increases in an S-shaped manner during at least a part of a period from when the solvent starts to be supplied to the substrate until when the solvent reaches the periphery edge of the substrate.

9. The substrate treating method according to claim 1, further comprising:
    a chemical supplying step of supplying a chemical to the substrate after supply of the solvent to the substrate is completed.

10. The substrate treating method according to claim 1, further comprising:
    a simple rotation step of rotating the substrate without supplying any processing liquid to the substrate after supply of the solvent to the substrate is completed.

11. A substrate treating method for treating the substrate, the substrate treating method comprising:
    a solvent supplying step of supplying a solvent to a center part of the substrate while increasing a rotation speed of the substrate, wherein
    in the solvent supplying step, the rotation speed of the substrate increases by three or more stages during a period from when the solvent starts to be supplied to the substrate until when the solvent reaches a periphery edge of the substrate,
    the solvent supplying step further comprises:
    a first constant speed step of maintaining the rotation speed of the substrate at a first speed while the solvent is supplied to the substrate;
    a second constant speed step of maintaining the rotation speed of the substrate at a second speed, higher than the first speed, subsequent to the first constant speed step; and
    a third constant speed step of maintaining the rotation speed of the substrate at a third speed, higher than the second speed, subsequent to the second constant speed step, and
    the third constant speed step starts before the solvent reaches the periphery edge of the substrate.

12. The substrate treating method according to claim 11, wherein
    in the solvent supplying step, the solvent is supplied to the substrate continuously until the solvent reaches the periphery edge of the substrate.

13. The substrate treating method according to claim 11, wherein
    the rotation speed of the substrate when the solvent reaches the periphery edge of the substrate is less than 1500 rpm.

14. The substrate treating method according to claim 11, wherein
the rotation speed of the substrate when the solvent reaches the periphery edge of the substrate is less than 200 rpm.

15. The substrate treating method according to claim 11, wherein
in the solvent supplying step, the rotation speed of the substrate increases in an S-shaped manner during at least a part of a period from when the solvent starts to be supplied to the substrate until when the solvent reaches the periphery edge of the substrate.

16. The substrate treating method according to claim 11, further comprising:
a chemical supplying step of supplying a chemical to the substrate after supply of the solvent to the substrate is completed.

17. A substrate treating method for treating a substrate, the substrate treating method comprising:
a solvent supplying step of supplying a solvent at a center part of the substrate while increasing a rotation speed of the substrate, wherein
the solvent supplying step further comprises:
a first constant speed step of maintaining the rotation speed of the substrate at a first speed while the solvent is supplied to the substrate;
a first accelerating step of increasing the rotation speed of the substrate from the first speed to a second speed, higher than the first speed, subsequent to the first constant speed step while the solvent is continuously supplied to the substrate;
a second constant speed step of maintaining the rotation speed of the substrate at the second speed subsequent to the first accelerating step while the solvent is continuously supplied to the substrate; and
a second accelerating step of increasing the rotation speed of the substrate from the second speed to a third speed, higher than the second speed, subsequent to the second constant speed step while the solvent is continuously supplied to the substrate.

18. A substrate treating method for treating a substrate according to claim 17, wherein the second accelerating step starts before the solvent reaches the periphery edge of the substrate.

* * * * *